United States Patent
Handtmann et al.

(10) Patent No.: US 8,018,303 B2
(45) Date of Patent: Sep. 13, 2011

(54) BULK ACOUSTIC WAVE DEVICE

(75) Inventors: Martin Handtmann, Munich (DE); Jyrki Kaitila, Riemerling (DE); Robert Thalhammer, Munich (DE); Bernhard Gebauer, Beyharting (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 641 days.

(21) Appl. No.: 11/871,711

(22) Filed: Oct. 12, 2007

(65) Prior Publication Data

US 2009/0096550 A1  Apr. 16, 2009

(51) Int. Cl.
*H03H 9/54* (2006.01)
(52) U.S. Cl. ........................ 333/189; 333/191
(58) Field of Classification Search .................. 333/189, 333/190, 191
See application file for complete search history.

(56) References Cited

U.S. PATENT DOCUMENTS

| | | | |
|---|---|---|---|
| 5,821,833 A | 10/1998 | Lakin | |
| 6,720,844 B1 | 4/2004 | Lakin | |
| 6,917,261 B2 * | 7/2005 | Unterberger | 333/189 |
| 6,933,807 B2 | 8/2005 | Marksteiner et al. | |
| 6,946,928 B2 | 9/2005 | Larson, III et al. | |
| 7,057,478 B2 * | 6/2006 | Korden et al. | 333/189 |
| 7,148,604 B2 * | 12/2006 | Inoue et al. | 310/322 |
| 7,173,504 B2 | 2/2007 | Larson, III et al. | |
| 7,212,083 B2 * | 5/2007 | Inoue et al. | 333/189 |
| 7,612,636 B2 * | 11/2009 | Jamneala et al. | 333/189 |
| 2004/0046622 A1 | 3/2004 | Aigner et al. | |
| 2005/0093656 A1 | 5/2005 | Larson, III et al. | |
| 2005/0128030 A1 | 6/2005 | Larson, III et al. | |
| 2006/0205361 A1 | 9/2006 | Ruby et al. | |

FOREIGN PATENT DOCUMENTS

EP  1 317 797 B1  6/2003
* cited by examiner

*Primary Examiner* — Robert Pascal
*Assistant Examiner* — Alan Wong

(57) ABSTRACT

An apparatus includes a stacked crystal filter and a bulk acoustic wave resonator, which are acoustically coupled.

9 Claims, 24 Drawing Sheets

BULK ACOUSTIC WAVE DEVICE

BACKGROUND

Embodiments of the present invention relate to the field of Bulk Acoustic Wave (BAW) devices and in particular to an impedance conversion between two ports.

SUMMARY OF THE INVENTION

Embodiments of the present invention comprise an apparatus comprising a stacked crystal filter and a bulk acoustic wave resonator, which are acoustically coupled.

BRIEF DESCRIPTION OF THE DRAWINGS

Features of embodiments of the invention will be more readily appreciated and better understood by reference to the following detailed description, which should be considered with reference to the accompanying drawings, in which:

FIG. 13 shows a pass band transfer function for a stack without a center tap as shown in FIG. 11a;

Figure 1:
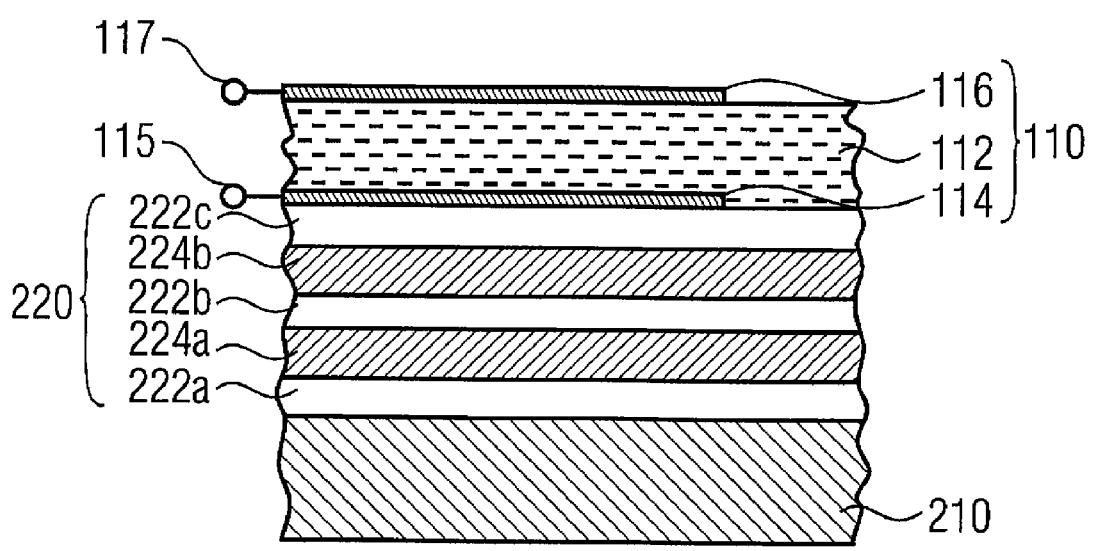
FIG. 1 shows a conventional BAW resonator.

Before embodiments of the present invention will be explained in more detail below with reference to the drawings, it is to be noted that equal elements or those operating in an equal way are provided with the same or similar reference numerals in the figures, and that a repeated description of these elements is omitted.

DETAILED DESCRIPTION OF ILLUSTRATIVE EMBODIMENTS

Conventional filter technologies, which, for example, are used in mobile applications for a frequency range of 1-10 GHz use, for example, Surface Acoustic Wave (SAW) filters or ceramic filters. A promising candidate for replacing these old filters are BAW (Bulk Acoustic Wave) resonators. A typical BAW resonator comprises a piezoelectric layer sandwiched between two electrodes and a resonator area defined by an area over which the piezoelectric layer is sandwiched by the electrodes. An acoustic isolation from an underlying substrate can be achieved either by creating an air interface on a bottom side (or substrate side) of the BAW resonator (and is also denoted by a membrane device) or by applying an acoustical mirror between the BAW resonator and the substrate. The latter one is the so-called solidly-mounted resonator (SMR). The acoustical mirror is typically composed of alternating high and low acoustic impedance materials proving good reflection of acoustic waves at an intended operation frequency. There are also various methods of producing a membrane device, either by a surface or by a bulk micromachining.

The BAW resonators can be used for constructing a ladder filter, wherein the ladder filter comprises (at least) two types of resonators, one connected in series and one used as a shunt. Both resonators typically operate at slightly different frequencies and, as result, a transfer characteristic is obtained, which typically comprises cascading multiple sections, so that a desired stop band performance can be achieved. The ladder filter comprises at least one section, wherein a single section comprises one series resonator and one shunt resonator and can be extended by further series and/or shunt resonators.

Another type of conventional filter is a Stacked Crystal Filter (SCF), which is a three terminal device and employs two piezoelectric layers in a way that each of the two piezoelectric layers is between two of the three terminal devices. As for the BAW resonator, a lateral area over which both piezoelectric layers are sandwiched by the three electrodes defines a resonator area. A middle terminal or the middle electrode between both piezoelectric layers can be used as a ground, which is connected to an input and output port. The other two electrodes or terminal devices can be used as a second connector for the input port and a second connector for the output port. When connected in this fashion, a transfer characteristic is obtained, which especially comprises an optimized stop band behavior for the filter, which is only restricted by a parasitic capacitance present in this implementation besides its acoustical behavior. However, an achievable bandwidth of such a device is rather limited and, therefore, a pass band performance of such a device may not be sufficient for some applications. This is a basic property of conventional SCF, which results from a strong acoustic coupling between the two piezoelectric layers (or resonators) constituting the device.

Yet another type can be formed as an extension of the SCF by arranging more piezoelectric layers, so that electrodes and the piezoelectric layers form an alternating layer structure, wherein a first electrode is followed by a first piezoelectric layer on which a second electrode is formed, on which a second piezoelectric layer is formed and so on until at last an electrode is formed on a last piezoelectric layer. The electrodes or some of them can form further output/input terminals or can be interconnected. Below a concrete example for this extended stacked crystal filter (eSCF) is used, wherein the first, third, fifth, . . . (all odd) electrodes are interconnected and in addition the second, fourth, . . . (all even) electrodes are also interconnected.

Both the traditional BAW filters and the SCFs suffer from several important drawbacks. Firstly, they offer no possibility of a mode conversion. Although it is possible to design a circuit exhibiting either single-to-single or fully balanced-to-balanced operation, the single-to-balanced mode converting option is unavailable. Secondly, only very limited possibilities for impedance level transformations are viable.

A promising candidate for mode and/or impedance-converting filters is a Coupled Resonator Filter (CRF). It comprises two piezoelectric layers and a four-port device (four electrodes or terminals) and offers a small size with good electrical performance. In a basic configuration, a CRF comprises a first piezoelectric layer sandwiched by two electrodes forming a first resonator (or a first resonator element) and a second piezoelectric layer sandwiched by two further electrodes forming a second resonator (or a second resonator element). A series of layers (coupling layers or a coupling layer structure) are placed between the first resonator element and the second resonator element to define an acoustic coupling between the first resonator element and the second resonator element. The coupling layers comprise layers of alternating high and low acoustic impedance materials, which is similar in a manner to the previously described acoustic mirror. By changing the number of the coupling layers, their composition and/or their thickness, the acoustical coupling between the first resonator element and the second resonator element can be tuned to a desired value. When the acoustical coupling comprises the desired value, the resulting CRF device operates in a so-called critical coupled mode exhibiting a wide pass band.

Coupled resonator filters overcome some of the problems mentioned above. Most importantly, the CRF can be used to achieve the single-to-balance transformation. However, the CRF suffers from a serious drawback. Apart from a 1:1 impedance ratio, it allows only multiples of 1:4 impedance transformations (or something fairly close to multiples of 1:4) without major sacrifices in the pass band characteristics (like the possible bandwidth). Hence, possible impedance transformations comprise, for example, 4:1, 1:1, 1:4; 1:16, . . . , when it is used in the impedance converting mode.

However, currently, there is a strong need for an impedance conversion ratio, such as 1:2 with a typical example of a conversion of 50 Ohm to 100 Ohm. Unfortunately, there is no practical way of producing this with currently available technologies, such as the described conventional BAW filters constructed from traditional BAW resonators or SCFs, CRFs or circuit variants employing any combinations of these.

Embodiments of the present invention relate to a BAW device and, in particular, to a device, which is capable of a 1:2 impedance conversion ratio for an input and output port. This is especially desirable in modern mobile communication systems. Other embodiments comprise an 8:1 impedance conversion ratio.

Embodiments describe in detail a new type of Bulk Acoustic Wave device, which is capable of a mode conversion and, moreover, which provides the 1:2 impedance transformation and comprises a stacked crystal filter and a bulk acoustic wave resonator, which are acoustically coupled. The bulk acoustic wave device comprises a first resonator with a first electrode, a first piezoelectric layer formed at least partially on the first electrode and a second electrode formed at least partially on the first piezoelectric layer. The Bulk Acoustic Wave device furthermore comprises a second resonator comprising a third electrode, a second piezoelectric layer formed at least partially on the third electrode, a fourth electrode formed at least partially on the second piezoelectric layer, a third piezoelectric layer formed at least partially on the fourth electrode and a fifth electrode formed at least partially on the third piezoelectric layer. The first resonator and the second resonator are formed on two sides of a coupling layer (or a coupling layer structure) defining the acoustic coupling.

In further embodiments, the Bulk Acoustic Wave device can comprise a substrate with an acoustic mirror or a membrane region, so that the stacked crystal filter and the bulk acoustic wave resonator are formed on the acoustic mirror, which comprises an arrangement of layers of alternating high and low acoustic impedances.

The role of the acoustic mirror is to (acoustically) isolate the Bulk Acoustic Wave device from the substrate in a manner that a vibration within the BAW device is substantially not hindered or the acoustic wave is suppressed to propagate into the substrate.

In further embodiments, at least one of the first, second, third, fourth and fifth electrodes comprise an assembly of layers with materials of different acoustic impedances as, for example, aluminum, titanium, tungsten, silver or copper. Especially aluminum and copper comprise a high conductivity and, moreover, are compatible with CMOS technology. A principle benefit of constructing electrodes comprising a plurality of layers is obtaining a higher electromechanical coupling coefficient, resulting from the use of high acoustic impedance material (enabling larger filter bandwidths), and good electrical conductivity of another material. This is especially true with a layered electrode structure comprising tungsten and aluminum.

In general, the piezoelectric layers can comprise one or more different layers, of which at least one exhibits a piezoelectric activity. The other layers between the top and bottom electrode, that sandwich the piezoelectric layer, can be non-piezoelectric-active dielectric or other layers to achieve special performance effects like temperature coefficient compensation or to facilitate manufacturing like adhesion layers. In addition, the other layers are typically thin when compared to a "real" piezoelectric (active) layer.

The second resonator is essentially given by a SCF-type structure with three electrodes and two piezoelectric layers. The second resonator is structured such that its resonant frequency for the first harmonic overtone is tuned, for example, suitably close to the resonant frequency of the first resonator. This means that the piezoelectric layer and the electrode thicknesses are arranged such that the resulting device has the correct frequency (there is, for example, a direct relation between the thickness of a piezoelectric layer and the resulting resonance frequency). In practice, for an optimally-designed structure, the thickness of both piezoelectric layers of the second resonator (the SCF structure) can be identical or very close to the thickness of the piezoelectric layer of the first resonator. For example, the thicknesses of the piezoelectric layers can coincide with a tolerance of +/−20%, +/−10% or +/−1%. By this arrangement, approximately one-half of a wavelength fits into the first resonator, whereas the second resonator (SCF structure), as a whole, supports a full wavelength of an acoustic wave.

The second resonator can be electrically seen as two BAW resonators connected in parallel. There is, however, an important difference to electric circuits with BAW resonators, namely that the two BAW resonators are acoustically coupled. This implies as a consequence, that in general higher harmonic excitations (harmonic overtones) are excited during operation, in contrast to an electric connection of separate BAW resonators.

A given piezoelectric layer is also characterized by their orientation, which refers to a specific direction or axis of the crystal of the piezoelectric layer along which the crystal shrinks or expands when an electric field is applied. Depending on the orientation of the electric field (related to the polarization of the voltage applied to electrodes on opposite sides of the crystal), the crystal shrinks or expands and, hence, the two orientations of the piezoelectric layer correspond to the two possibilities (shrinking or expanding) of the crystal, when the electric field is applied.

The orientation of both piezoelectric layers in the SCF play an important role to excite the overtones. For example, both orientations can be parallel and in this case the first harmonic can be excited. Otherwise, if both orientations of both piezoelectric layers are anti-parallel, a principle mode is excited in the SCF. Similarly, if there are more piezoelectric layers as in the before mentioned eSCF, all of them can comprise a same orientation and dependent on the number of piezoelectric layers a higher harmonic is excited (for n piezoelectric layers the excited acoustic wave comprise n/2 wavelengths within the eSCF). If the orientations are alternating anti-parallel (adjacent piezoelectric layers comprise anti-parallel orientations) the principle mode can again be excited. The relative orientation of piezoelectric layers of resonators that are coupled only acoustically, i.e., between the SCF (or eSCF) and the BAW, can be chosen freely. This applies especially if the electrodes are interconnected in an alternating structure (as described before). For arbitrary interconnections even more modes can be excited.

In further embodiments, the Bulk Acoustic Wave device comprises additional layers as, for example, passivation layers, vias and/or structures or methods to overcome spurious resonances. The passivation layer, can, for example, be formed on a side, which is opposite to the substrate with the acoustic mirror. Contact vias can, for example, contact at least one of the first, second, third, fourth or fifth electrodes.

In additional embodiments, the Bulk Acoustic Wave device laterally extends as a membrane or is formed as a membrane comprising air layers/interfaces on both sides of the membrane instead of the acoustic mirror on one side thereof. The membrane may be fixed, for example, with ends of at least one of the piezoelectric layers. Alternatively, the BAW device can also be formed on a membrane, which offers an acoustic decoupling so that the acoustic mirror can be omitted.

In further embodiments, the first electrode is connected to a first terminal of a first port, and the second electrode is connected to a second terminal of a first port. In addition, the fourth electrode is connected to a first terminal of the second port, and the third and fifth electrodes are connected to a second terminal of the second port. In additional embodiments, the first, second, and third piezoelectric layers are dimensioned such that a ratio of an impedance at the first port to an impedance at the second port comprise a predetermined value, which can comprise, for example, a value of 2:1 or 1:2 (within a tolerance of +/−20% or, better, +/−10% or +/−1%).

This may be possible, for example, if the first, second and third piezoelectric layers comprise the same material, same active area and a same layer thickness with a tolerance of +/−10% or, better, +/−3%. Similarly, a material and/or layer thicknesses and/or lateral extensions of a layer assembly for the first, second, third, fourth and fifth electrode can be such that the impedance transformation ratio is achieved and/or the layer thickness and lateral extension comprise a same value within a tolerance of +/−10% or, better, +/−5%.

Furthermore, contact areas of the first and second electrode with the first piezoelectric layer comprise for the first resonator a first piezoelectric active area (resonator area), and further contact areas of the third, fourth, and fifth electrode with the second and third piezoelectric layers comprise for the second resonator a second piezoelectric active area (resonator area), so that surface areas of the first and second active area coincide within a tolerance of ±20%, or of ±5%. In further embodiments, the first, second and third piezoelectric layers may comprise a parallel piezoelectric orientation, for example, perpendicular to lateral extensions of the first, second and third piezoelectric layers.

In further embodiments, the Bulk Acoustic Wave device, in addition, comprises a third resonator, a fourth resonator, a further coupling layer structure, a first port and a second port. The third resonator comprises a sixth electrode, a fourth piezoelectric layer formed at least partially on the sixth electrode, a seventh electrode formed at least partially on the fourth piezoelectric layer. The fourth resonator comprises an eighth electrode, a fifth piezoelectric layer formed at least partially on the eighth electrode, a ninth electrode formed at least partially on the fifth piezoelectric layer, a sixth piezoelectric layer formed at least partially on the ninth electrode, a tenth electrode formed at least partially on the sixth piezoelectric layer. The further coupling layer structure is formed between the third resonator and the fourth resonator. The first port comprises a first terminal connected to the first electrode and a second terminal connected to the seventh electrode. The second port comprises a first terminal connected to the third electrode and the fifth electrode, and a second terminal connected to the ninth electrode. Finally, the fourth, eighth, and tenth electrodes are connected with each other, and the second and sixth electrodes are connected with each other. In additional embodiments, the bulk acoustic wave device comprises a common electrode (center tap), wherein the fourth, eighth, and tenth electrodes are connected to the common electrode. The common electrode provides therefore a terminal for a common mode (not differential mode), which may be used by subsequent circuits.

In further embodiments, the coupling layer structure, which is arranged at least partially between the first and second resonators or between the third and fourth resonators may comprise an assembly of layers with alternating higher and lower acoustic impedances and, hence, can comprise similar materials as the acoustic mirror. The coupling layer structure can serve a same purpose as for the CRF, to tune the acoustical coupling, for example, between the first and the second resonator to a desired value for a large bandwidth of the resulting filter. In addition, layer thicknesses for the layer assembly of the coupling layer structure may influence a bandwidth of a pass band filter, which is manufactured in terms of the Bulk Acoustic Wave device.

In additional embodiments the second resonator is formed between the first resonator and the substrate with the acoustic mirror and the resulting electrical operation is, in a sense, identical to the embodiments where the first resonator is in between the second resonator and the substrate. However, slight differences in coupling coefficients of the resonators and an ever-present parasitic capacitance might make it useful to design the device slightly differently with regard to individual layer thickness. Whether the Bulk Acoustic Wave device, with the first or the second resonator formed on the substrate, is chosen for a particular application depends on an application and manufacturing conditions. Furthermore, if the Bulk Acoustic Wave device is to be combined with more traditional circuitry, such as the aforementioned BAWs, SCFs and/or CRFs monolithically on a single substrate, more manufacturing conditions, which sometimes impose severe requirements, may influence the choice to be made (whether the first or second resonator is formed on the substrate).

In further embodiments, the filter comprises passband characteristics comprising a central frequency and a bandwidth when at least one thickness of the layer of the plurality of the first, second or third piezoelectric layers and the coupling layer structure are such that the central frequency at the bandwidth comprise predetermined target values. In additional embodiments, the filter comprises at least one layer thickness, such that a parasitic capacitance is minimized.

The impedance of a BAW device can be changed in discrete steps by changing the number of piezoelectric layers and form layer arrangements as for the SCF or the eSCF. In the simplest case, the SCF corresponds electrically to two parallel connected BAW resonators and hence inverse impedances will add so that the impedance of the corresponding port can be changed. Another possibility for changing an output/input impedance at a given port is by changing the geometry of the piezoelectric sandwich structure. The impedance at the first and/or second port can, for example, be adjusted or changed by varying layer thicknesses of the first, second or third piezoelectric layers. In addition, a piezoelectric active area (resonator area), which comprises the area over which the piezoelectric layer is sandwiched between two electrodes, influences the impedances. By changing the piezoelectric active area the impedance of the resonator element will change. Finally, replacing the material of the piezoelectric layers (e.g., with different dielectric constants or ∈-value) will change the impedance.

FIG. 1 shows a conventional BAW resonator with a piezoelectric layer 112, a first electrode 114 with a first terminal 115 and a second electrode 116 with a second terminal 117. The first electrode 114 and the second electrode 116 are formed, at least partially, on two opposite sides of the piezoelectric layer 112. The BAW resonator shown in FIG. 1 is a so-called solidly mounted resonator (SMR), which implies that the resonator 110 is formed on a substrate 210 with an acoustic mirror 220, wherein the acoustic mirror 220 comprises a layer assembly. The layer assembly comprise layers of alternating higher and lower acoustic impedances, so that a first layer of low acoustic impedance 222a is formed on the substrate 210, a first layer of high acoustic impedance 224a is formed on the layer with low acoustic impedance 222a, followed by a second layer of low acoustic impedance 222b, followed by a second layer of high acoustic impedance 224b and, finally, followed by a third layer of low acoustic impedance 222c.

Figure 2:
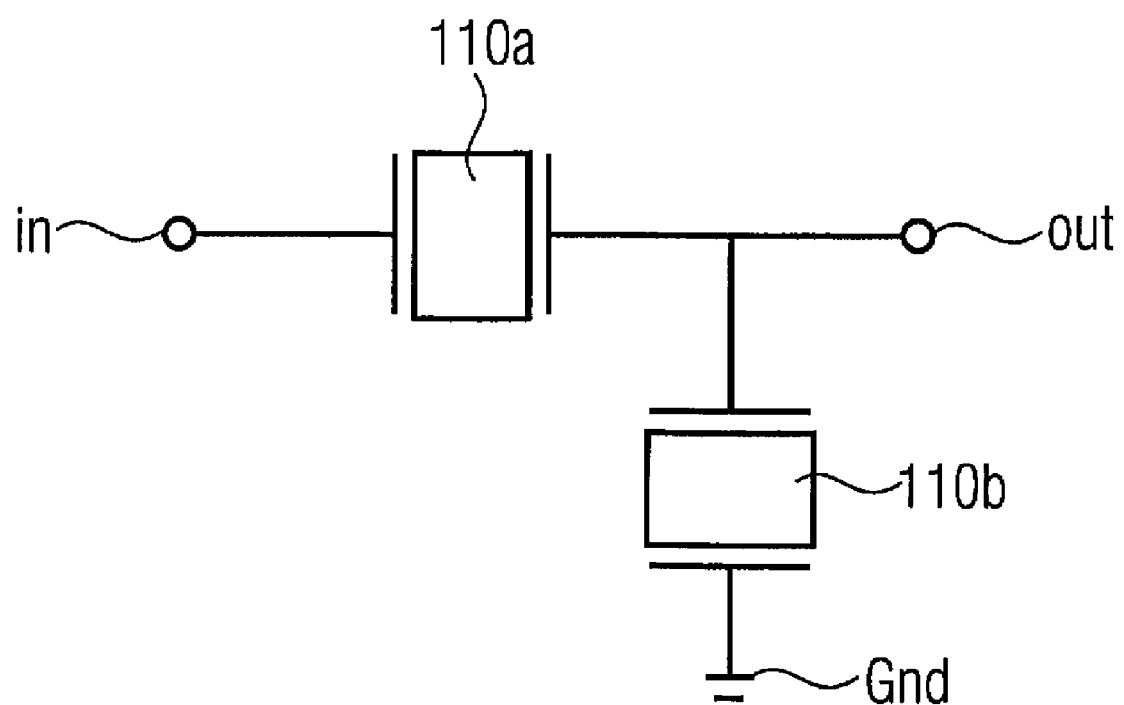
FIG. 2 shows a single section ladder filter formed by BAW resonators.

FIG. 2 shows a single section of a ladder filter formed by two BAW resonators, a first BAW resonator 110a and a second BAW resonator 110b. The first BAW resonator 110a is connected between an In-terminal and an Out-terminal, and the second BAW resonator 110b connects the Out-terminal to ground (Gnd). In further embodiments, this single section of the ladder filter is repeated, for example, by connecting the Out-terminal of the single section, as shown in FIG. 2, by a further In-terminal of a further section of the ladder filter. A finally arranged ladder filter may, therefore, comprise several sections, each one structured as shown in FIG. 2.

Figure 3:
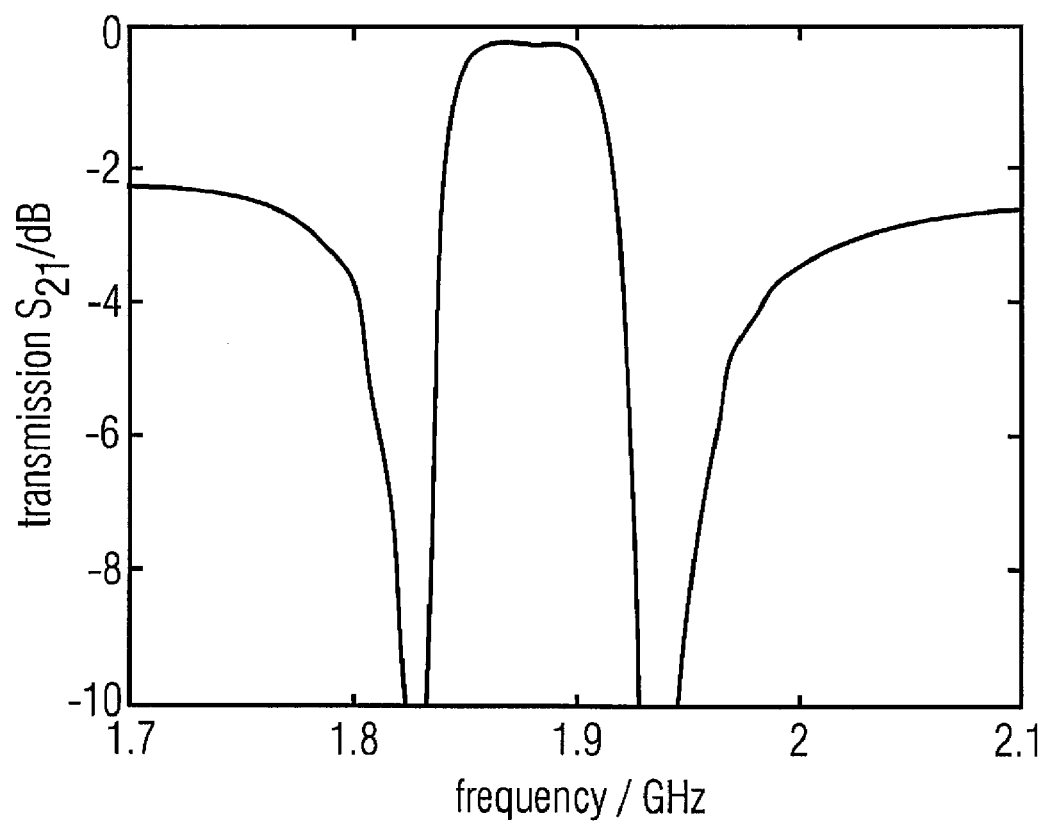
FIG. 3 shows a transfer characteristic of a single section ladder filter.

FIG. 3 shows a transfer characteristics of the single section of a ladder filter. A transmission $S_{21}$ (measured in dB) is shown here as a function of a frequency, as measured in GHz. The transmission $S_{21}$ measures, for example, the energy loss of a signal passing a filter, which in this example, is the ladder filter. Since the transmission $S_{21}$ signal measures an attenuation, a zero-value corresponds to a signal passing the filter without loss. The graph shows that around a central frequency of about 1.89 GHz, the transmission $S_{21}$ exhibits a maximum, around which the signal exhibits almost no loss. This maximum has a certain width, which approximately extends from 1.85 GHz to 1.92 GHz and outside this region the graph falls rapidly to minima, which are at about 1.83 GHz and a second one is at about 1.94 GHz. For frequencies below 1.84 GHz and for frequencies above 1.94 GHz, the graph, again, increases monotonically. This graph shows the characteristics for a single section, whereas multiple sections achieve a desired stop band performance.

Figure 4:
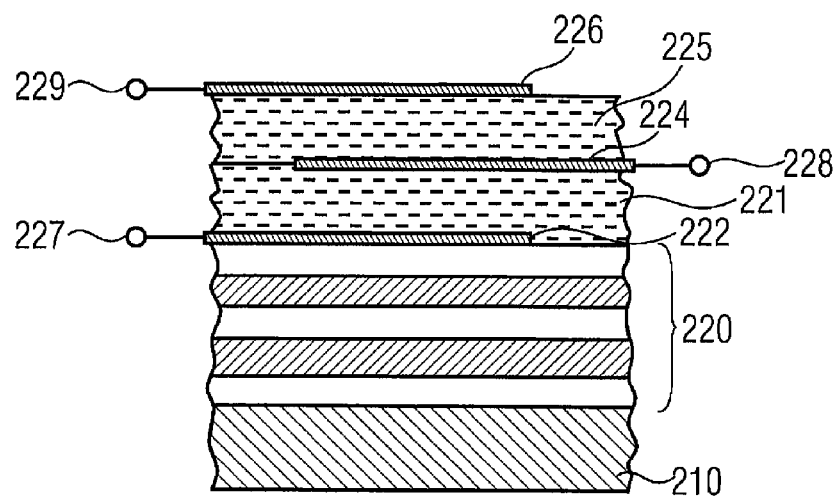
FIG. 4 shows a cross-sectional view of a stacked crystal filter.

FIG. 4 shows a stacked crystal filter (SCF) with a second piezoelectric layer 221 formed at least partially on a third electrode 222. A fourth electrode 224 is formed at least partially on the second piezoelectric layer 221 and a third piezoelectric layer 225 is formed at least partially on the fourth electrode 224 and, finally, a fifth electrode 226 is formed at least partially on the third piezoelectric layer 225. The third electrode 222 may comprise a third terminal 227, the fourth electrode 224 may comprise a fourth terminal 228 and the fifth electrode 226 may comprise a fifth terminal 229. The SCF can, again, be formed on a substrate 210 with an acoustic mirror 220, which has been described in more detail in FIG. 1.

Figure 5:
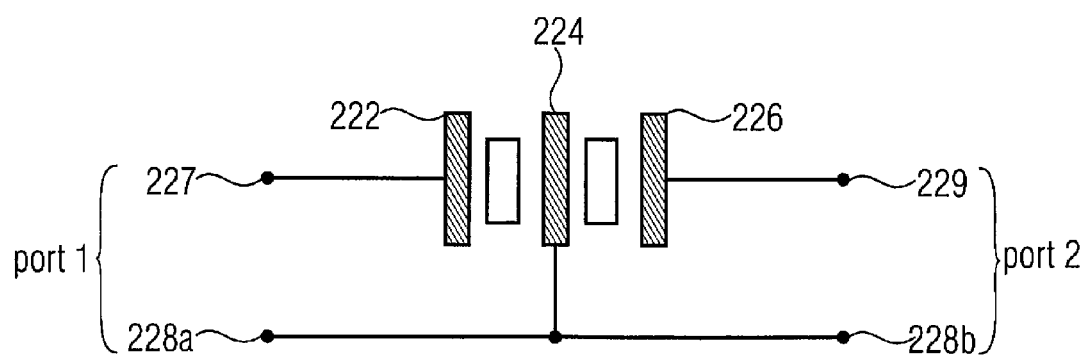
FIG. 5 shows a basic circuitry for a stacked crystal filter.

FIG. 5 shows a basic circuitry for a stacked crystal filter, as shown in FIG. 4. In this circuitry, the fourth terminal 228 is split into a first part of the fourth terminal 228a and a second part of the fourth terminal 228b, both being connected to the fourth electrode 224. The circuitry as shown in FIG. 5 comprises a port 1 with the first part of the fourth terminal 228a and the third terminal 227, and a port 2 comprising the second part of the fourth terminal 228b and the fifth terminal 229.

Figure 6:
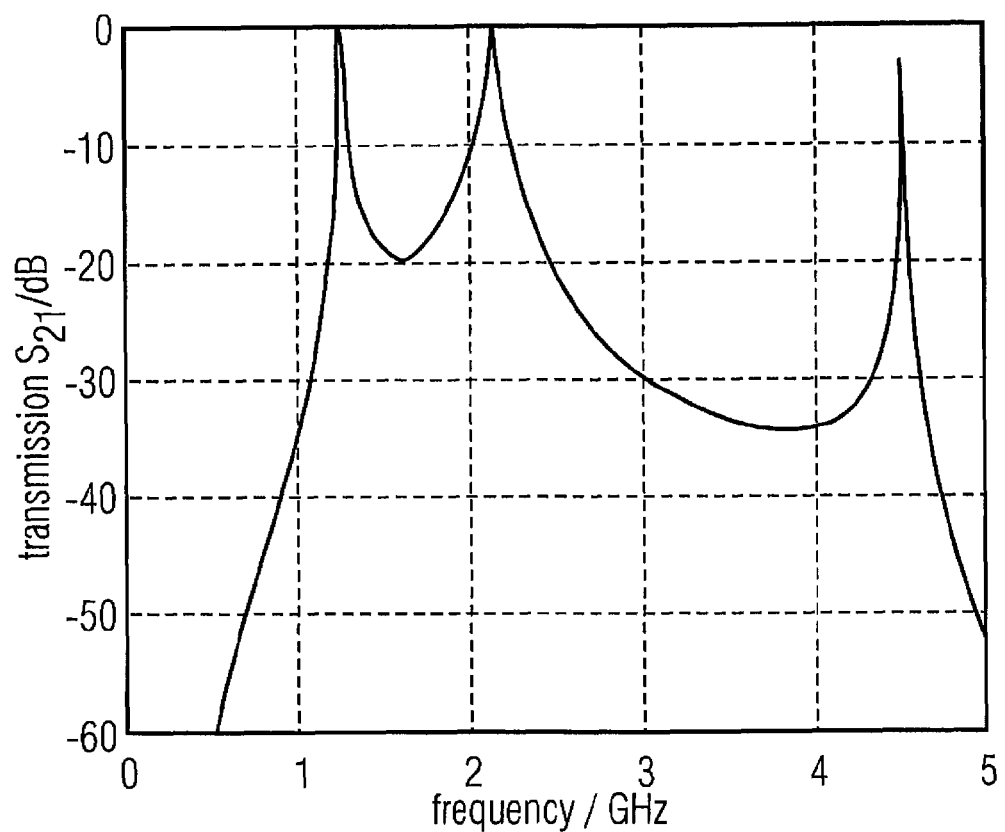
FIG. 6 shows a transfer characteristic of the stacked crystal filter.

FIG. 6 shows a transfer characteristics of the SCF, for example, using the circuitry of FIG. 5. The transmission function $S_{21}$ (again measured in dB) is shown here for a signal propagating between port 1 and port 2, for example. The transmission graph shows three maxima, one at around 1.3 GHz, a second one at around 2.2 GHz and the third one at around 4.5 GHz and two minima are in between the three maxima. The transmission drops rapidly for frequency below the first maximum and for frequency above the third maximum. This graph, as shown in FIG. 6, is obtained by a membrane-type device, that means without an acoustic mirror 220 in the substrate 210, as it was shown in FIG. 4. The characteristics in the presence of an acoustic mirror 220 would be qualitatively similar, except that the additional passbands at around 1.3 GHZ and 4.5 GHz would be more suppressed if the acoustic mirror is optimally designed.

Figure 7A:
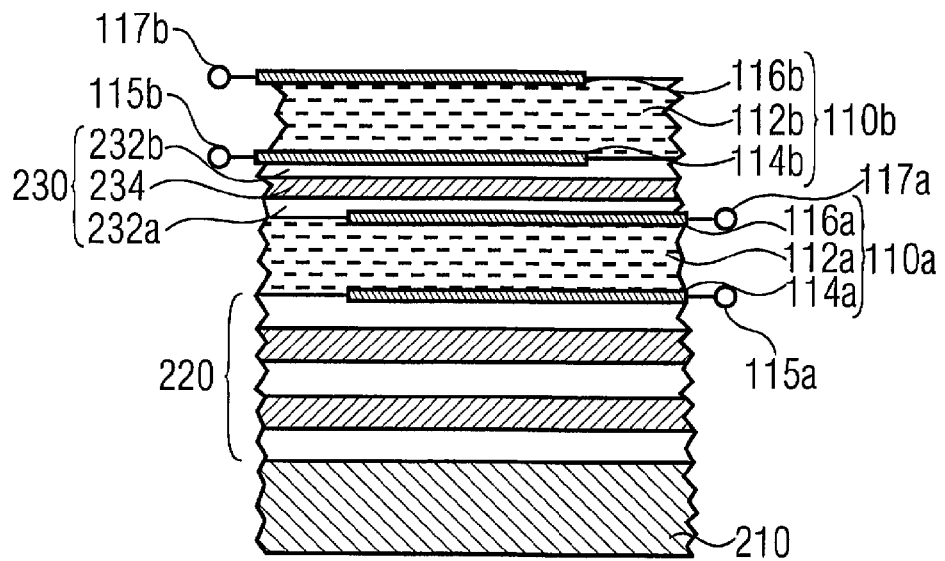
FIGS. 7a-7b show a cross-sectional view of a coupled resonator filter and its transfer characteristics.
Figure 7B:
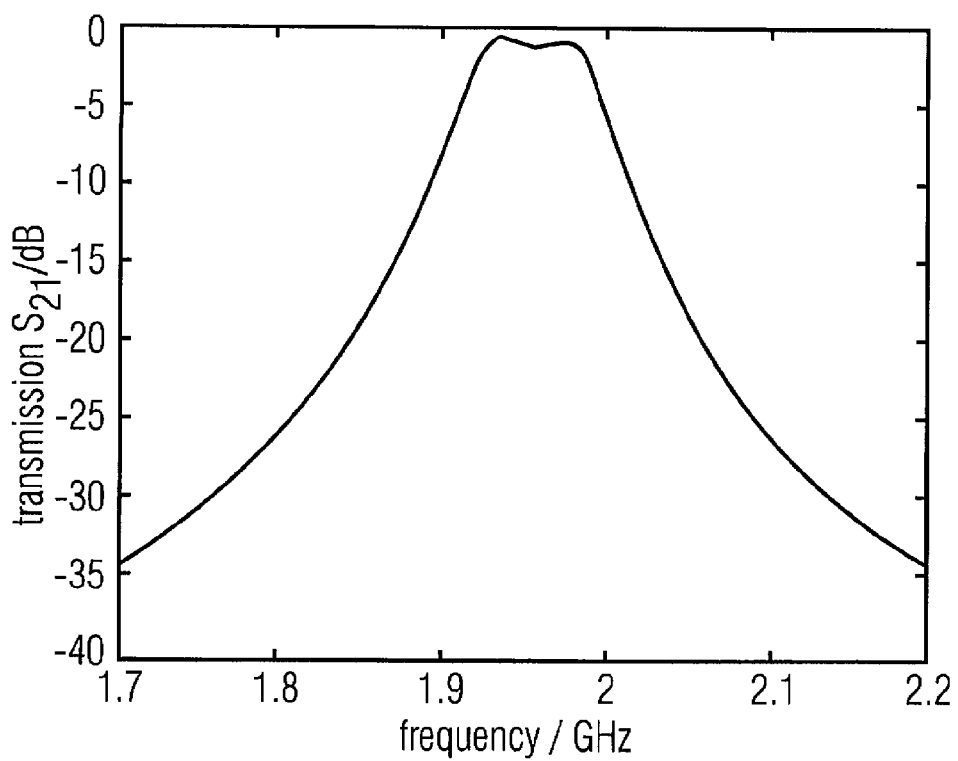

FIG. 7a shows a coupled resonator filter (CRF) comprising a layer arrangement and a corresponding characteristic, as shown in FIG. 7b. It comprises a BAW resonator 110a with a first piezoelectric layer 112a between a first electrode 114a and a second electrode 116a. A further BAW resonator 110b comprises a further piezoelectric layer 112b between a further first electrode 114b and a further second electrode 116b. The BAW resonator 110a and the further BAW resonator 110b are formed on two sides of a coupling layer structure 230. The coupling layer structure 230 may comprise an assembly of layers of alternating high and low acoustic impedances. As an example, a coupling layer of low acoustic impedance 232a is formed at least partially on the BAW resonator 110a, on which a coupling layer of high acoustic impedance 234 is formed at least partially, on which a second coupling layer of low acoustic impedance 232b is formed at least partially, on which the further first electrode 114b is formed at least partially followed by the further piezoelectric layer 112b and the further second electrode 116b. The first electrode 114a can, again, comprise a first terminal 115a, the second electrode 116a may comprise a second terminal 117a and, in a similar way, the further first electrode 114b may comprise a further first terminal 115b and, finally, the further second electrode 116b may comprise a further second terminal 117b. The CRF can, again, be arranged as a solidly mounted resonator, that means on a substrate 210 with an acoustic mirror 220. Again, the acoustic mirror 220 has been described in more detail in the context of FIG. 1 and a repeated description is omitted here.

The transfer characteristics of the CRF, as shown in FIG. 7a, is displayed in FIG. 7b, where a transmission $S_{21}$ (measured, again, in dB) is shown as a function of the frequency as measured in GHz. Starting with low frequencies, the transmission $S_{21}$ is a monotonic increasing function up to a maximum at around 1.93 GHz and a second maximum at around 1.96 GHz. For higher frequencies, the transmission $S_{21}$ is a monotonically decreasing function and the transmission $S_{21}$ remains almost constant comprising a passband between the two maximums (apart from a small minimum at around 1.94 GHz). FIG. 7b shows that the CRF exhibits a wide passband behavior, wherein the width of the passband (being defined as separation of intercept points at certain level, for example, at 3 dB) may be arranged appropriately by the coupling layer structure 230 between the BAW resonator 110a and the further BAW resonator 110b. The central frequency of this passband on the other hand, which is at around 1.94 GHz, may be adapted, for example, by choosing the resonant frequency of the BAW resonators 110a and 110b (for example, by modifying the thickness of piezoelectric layers 112a and 112b accordingly).

Figure 8A:
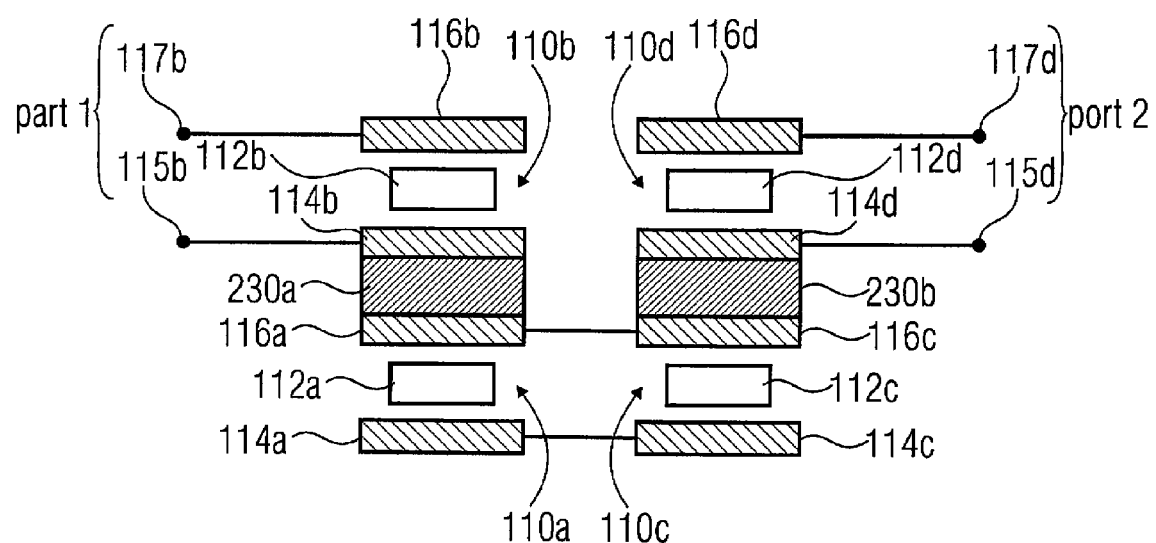
FIGS. 8a-8c show a circuitry for a coupled resonator filter implementing a 1:1, 1:4 and 4:1 impedance conversion.
Figure 8B:
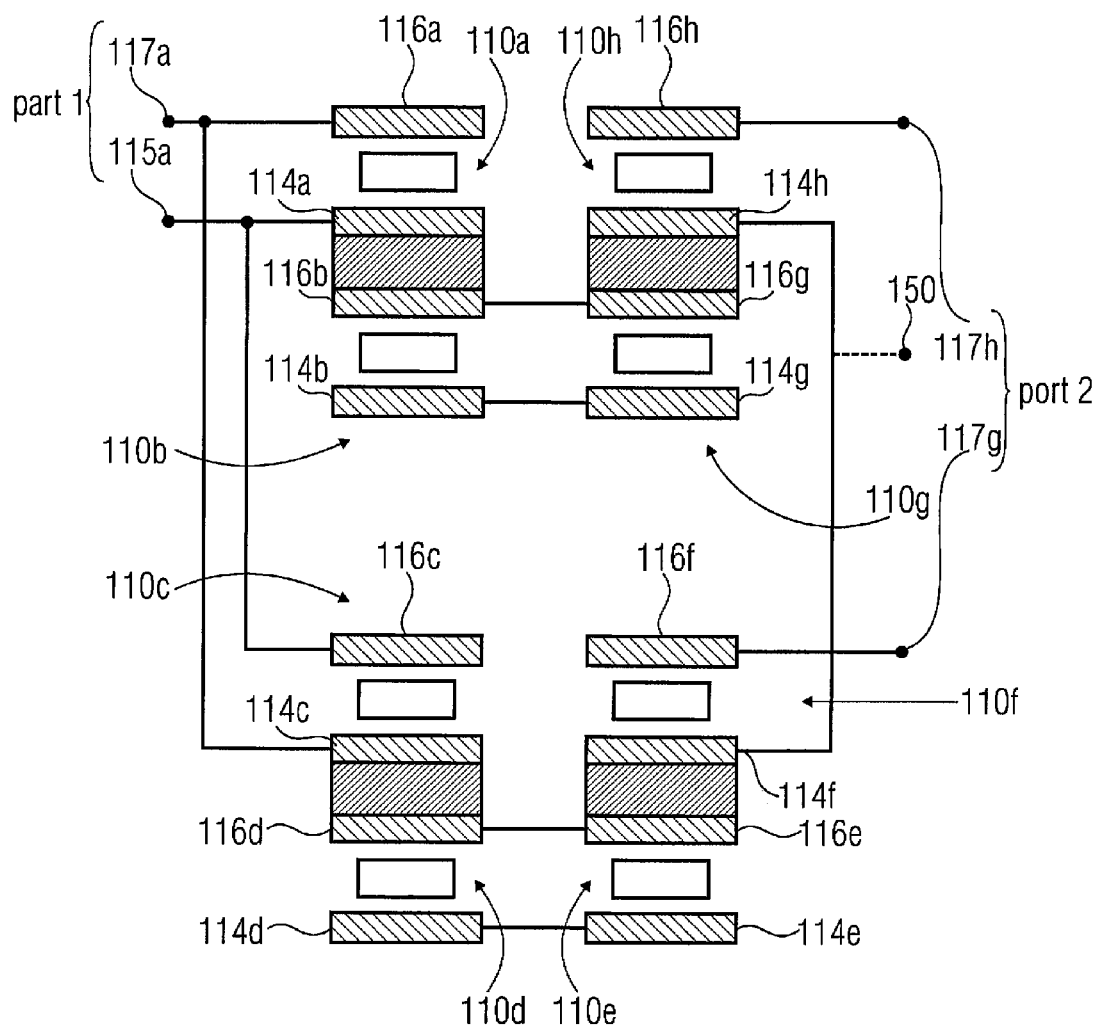
Figure 8C:
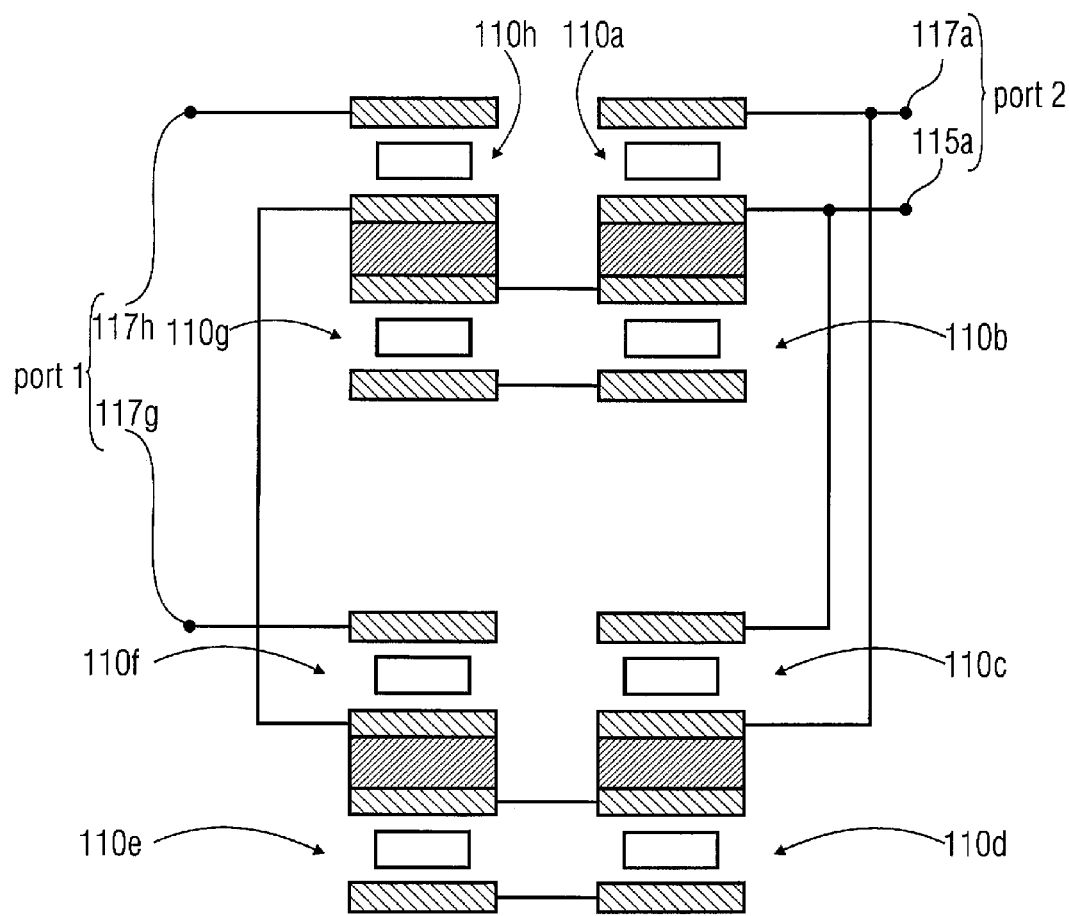

FIGS. 8a-8c show various circuitries using CRFs, which implement different impedance conversions.

FIG. 8a shows an example for a circuitry comprising two CRFs implementing a 1:1 impedance ratio and hence no conversion. A first coupled resonator comprises a first BAW resonator 110a and a second BAW resonator 110b, wherein the second terminal 117b of the second BAW resonator 110b and the first terminal 115b of the second BAW resonator 110b comprise a port 1. The first BAW resonator 110a and the second BAW resonator 110b are formed on opposite sides of a first coupling layer structure 230a. A second coupled resonator comprises a third BAW resonator 110c and a fourth BAW resonator 110d, wherein the second terminal 117d of the fourth BAW resonator 110d and the first terminal 115d of the fourth BAW resonator 110d comprise a port 2. The third BAW resonator 110c and the fourth BAW resonator 110d are formed on opposite sides of a second coupling layer structure 230b. The first electrodes 114a, 114c of the first and third BAW resonator 110a, 110c are connected, and the second electrodes 116a, 116c of first and third BAW resonator 110a, 110c are connected.

Each BAW resonator comprise a piezoelectric layer, that means the first BAW resonator 110a comprises a first piezoelectric layer 112a, the second BAW resonator 110b comprises a second piezoelectric layer 112b, the third BAW resonator 110c comprises a third piezoelectric layer 112c and the fourth BAW resonator 110d comprises a fourth piezoelectric layer 112d.

In further embodiments, the piezoelectric layers or the resonator area extend over a surface area A, which coincide for all four BAW resonators with a tolerance of +/−10% and, moreover, layer thickness of the piezoelectric layers 112a, 112b, 112c and 112d coincide with a tolerance of +/−10%. In addition, the electrodes 114a, 114b, 114c, 114d and 116a, 116b, 116c, 116d may comprise the same surface area for all four BAW resonators 110a, 110b, 110c and 110d. If the BAW resonators 110a, 110b, 110 c, 110d are dimensioned in the same way to a given accuracy, the impedance conversion ratio may be 1:1 to the given accuracy. Apart from the geometry (layer thickness and area), the impedance of a given BAW resonator depends also on the material for the piezoelectric layer.

FIG. 8b shows a CRF, which may implement a 1:4 impedance conversation. The CRF comprises four coupled resonators, a first coupled resonator comprising a first BAW resonator 110a and a second BAW resonator 110b, a second coupled resonator comprising a third BAW resonator 110c and a fourth BAW resonator 110d, a third coupled resonator comprising a fifth BAW resonator 110e and a sixth BAW resonator 110f, a fourth coupled resonator comprising a seventh BAW resonator 110g and an eighth BAW resonator 110h. Each of the eight BAW resonators again comprises a first electrode 114 and a second electrode 116, which are connected in the following way. The first electrode 114a and the second electrode 116a of the first BAW resonator 110a comprise a port 1. The first electrode 114a of the first BAW resonator 110a is connected to the second electrode 116c of the third BAW resonator 110c. The second electrode 116a of the first BAW resonator 110a is connected to the first electrode 114c of the third BAW resonator 110c. The first electrode 114b of the second BAW 110b resonator is connected to the first electrode 114g of the seventh BAW resonator 110g and, similarly, the second electrode 116b of the second BAW resonator 110b is connected to the second electrode 116g of the seventh BAW resonator 110g. In addition, the first electrode 114d of the fourth BAW resonator 110d is connected to the first electrode 114e of the fifth BAW resonator 110e. The second electrode 116d of the fourth BAW resonator 110d is connected to the second electrode 116e of the fifth BAW resonator 110e. The first electrode 114f of the sixth BAW resonator 110f is connected to the first electrode 114h of the eighth BAW resonator 110h. The second electrode 116f of the sixth BAW resonator 110f comprise a first terminal 117f of the port 2 and the second electrode 116h of the eighth BAW resonator 110h comprise a second terminal 117h of the port 2. In further embodiments, the first electrode 114f of the sixth BAW resonator 110f and the first electrode 114h of the eighth BAW resonator 110h are connected to a common electrode or center tap 150.

If each of the eight BAW resonators 110a, . . . , 110h comprise the same geometry, as explained in the context of FIG. 8a, this CRF can implement a 1:4 impedance conversion for a signal passing between port 1 and port 2.

FIG. 8c shows a CRF, which may implement a 4:1 impedance conversion for a signal at port 1 and port 2. The CRF as shown in FIG. 8c, again comprises eight BAW resonators 110a, . . . , 110h, wherein the circuitry is mirrored when compared to the circuitry as shown in FIG. 8b (exchanging port 1 and port 2). Hence, port 1 in FIG. 8c comprises the first terminal 117f (connected to the sixth BAW resonator 110f) and the second terminal 117h (connected to the eighth BAW resonator 110h). Port 2 in FIG. 8c comprises the first terminal 115a and the second terminal 117a (both connected to the first BAW resonator 110a). Since the circuitry of FIG. 8c is simply a mirror of the circuitry shown in FIG. 8b (exchanging port 1 and port 2), a repeated description is omitted here.

Figure 9:
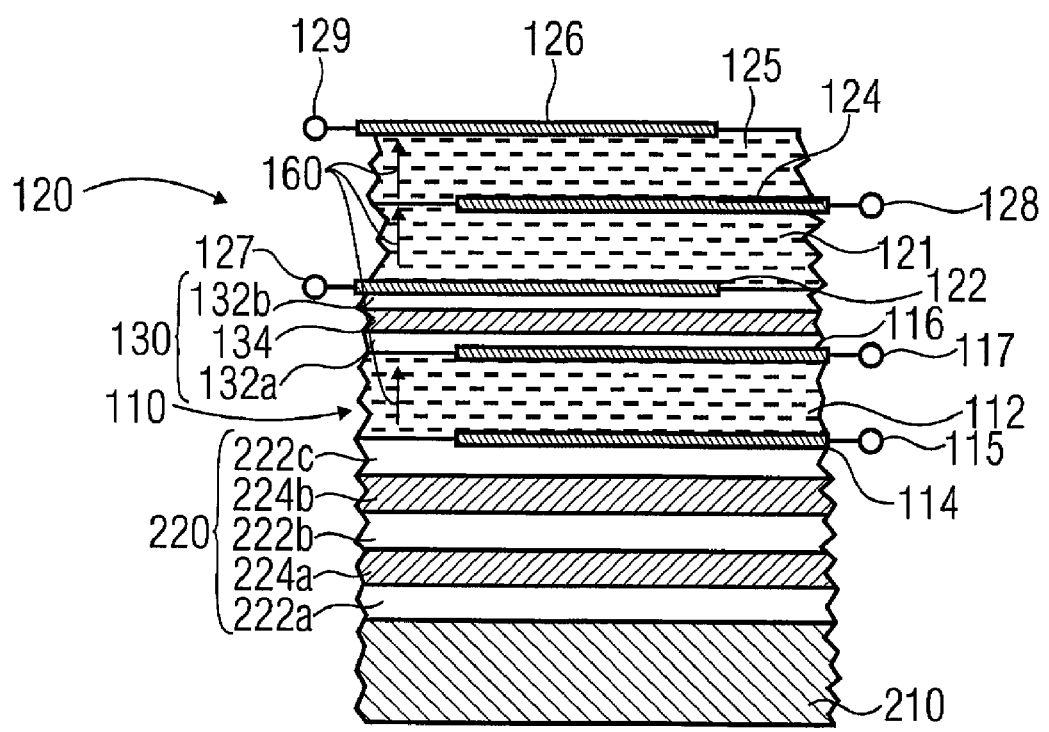
FIG. 9 shows an embodiment of the present invention comprising a BAW resonator and a stacked crystal filter.

FIG. 9 shows an embodiment of the present invention, which comprises a BAW resonator 110, a stacked crystal filter (SCF) 120 and an acoustic coupling layer structure 130 between the BAW resonator 110 and the SCF 120. The BAW resonator 110 comprises a first piezoelectric layer 112 formed at least partially on a first electrode 114 and a second electrode 116 formed at least partially on the piezoelectric layer 112, the first electrode 114 comprises a first terminal 115 and the second electrode 116 comprises a second terminal 117. The SCF 120 comprises a second piezoelectric layer 121 formed at least partially on a third electrode 122 and a fourth electrode 124 formed at least partially on the third piezoelectric layer 121. The SCF 120, moreover, comprises a third piezoelectric layer 125 formed at least partially on the fourth electrode 124 and a fifth electrode 126 formed at least partially on the third piezoelectric layer 125. The third electrode 122 comprises a third terminal 127, the fourth electrode 124 comprises a fourth terminal 128 and the fifth electrode 126 comprises a fifth terminal 129.

An acoustic coupling layer structure 130 may be arranged between the BAW resonator 110 and the SCF 120, wherein the acoustic coupling layer structure 130 comprises an assembly of layers of alternating high and low acoustic impedances. For example, a first coupling layer with low acoustic impedance 132a is formed at least partially on the second electrode 116, a coupling layer of high acoustic impedance 134 is formed at least partially on the first coupling layer with low acoustic impedance 132a and, finally, a second coupling layer with low acoustic impedance 132b is formed on the coupling layer with high acoustic impedance 134. The SCF 120 may be arranged on the coupling layer structure 130 such that the third electrode 122 being formed on the second coupling layer with low acoustic impedance 132b.

In further embodiments, the Bulk Acoustic Wave device is formed on a substrate 210 with an acoustic mirror 220. The acoustic mirror 220 may comprise an assembly of layers of lower and higher acoustic impedances, for example, a first layer of low acoustic impedance 222a is formed on the substrate 210, followed by a first layer of high acoustic impedance 224a, followed by a second layer of low acoustic impedance 222b, followed by a second layer of high acoustic impedance 224b, followed by a third layer of low acoustic impedance 222c. The BAW resonator 110 may be formed on the acoustic mirror 220 such that the first electrode 114 is formed on the third layer with low acoustic impedance 222c.

In additional embodiments, the piezoelectric layers 112, 121 and 125 comprise a parallel piezoelectric orientation, as indicated by the arrows 160, which may be perpendicular to the lateral extensions of the layer assembly.

Figure 10:
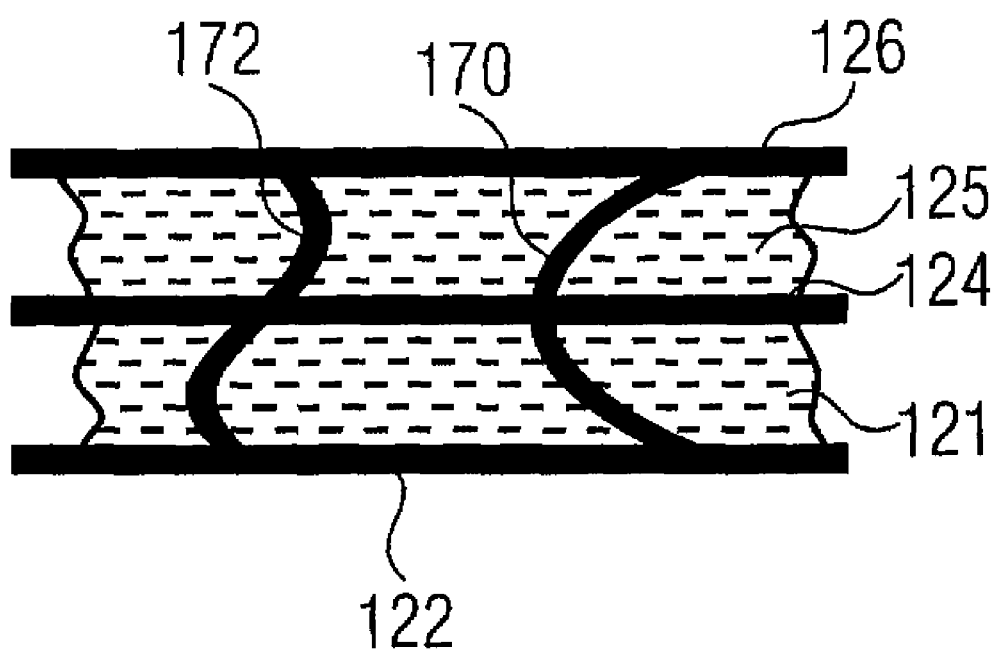
FIG. 10 shows a schematic of two lowest modes excited by the stacked crystal filter.

FIG. 10 shows a schematic of two lowest modes of the SCF. In particular, the stress fields associated with displacements at resonances are plotted. The SCF 120 (of FIG. 9) comprises the second piezoelectric layer 121 sandwiched between the third electrode 122 and the fourth electrode 124 and the third piezoelectric layer 125 is sandwiched between the fourth electrode 124 and the fifth electrode 126. For the stress field, a principle mode 170 and the first harmonic mode 172 are plotted, wherein the principle mode 170 comprise the lowest resonant frequency and the first harmonic 172 comprise a first excited resonant frequency (higher excitations are omitted here). For the first harmonic mode 172, a full wave length of the acoustic wave fits in the layer assembly of the second and third piezoelectric layers 121, 125 and the third and fifth electrode 122, 126, whereas for the principle mode 170 only one half of the wavelength fits into the layer assembly. Hence, the frequency (which corresponds to the wave length) of the principle mode 170 and the first harmonic mode 172 differ and depend especially on layer thicknesses of the piezoelectric layers 121, 125.

In further embodiments, the resonance frequency of the BAW resonator 110 is very close to the first harmonic 172 of the SCF 120. The resonance frequency represents, however, a principle mode in the BAW resonator 110, since the thickness of the piezoelectric active areas of the BAW and SCF are different. The corresponding frequency adjustment (between BAW and SCF) can, for example, be achieved by varying the thickness of the piezoelectric layers 112, 121 and 125 and the thickness of the electrodes 114, 116, 122, 124 and 126. As one example, all piezoelectric layers may comprise a same layer thickness. It assumed here, that the orientations of the piezoelectric layers is the same (parallel).

Figure 11A:
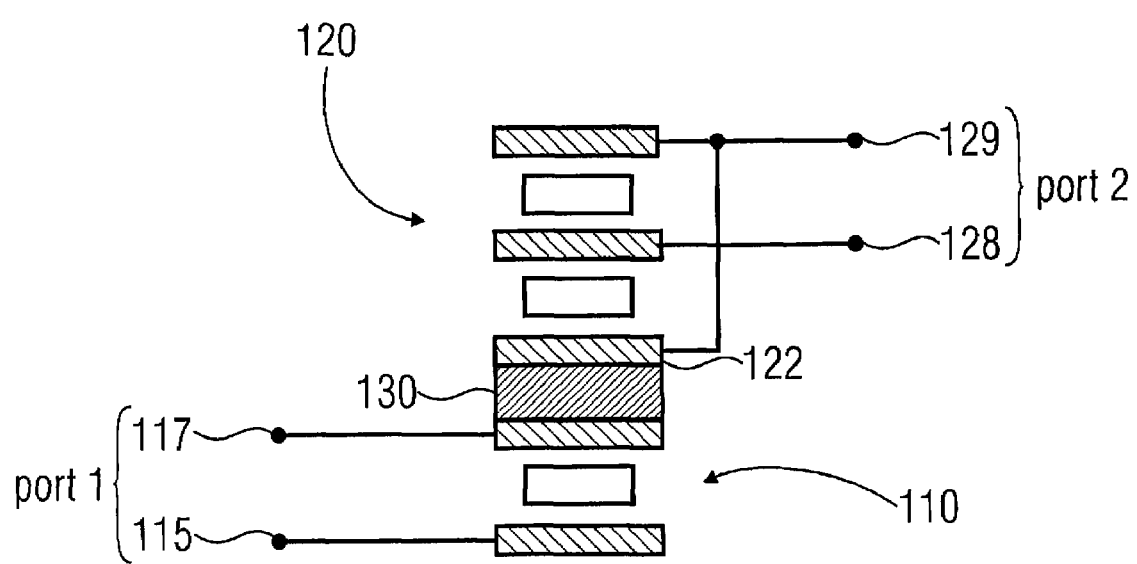
FIGS. 11a-11e show a circuitry without and with a center tap.
Figure 11B:
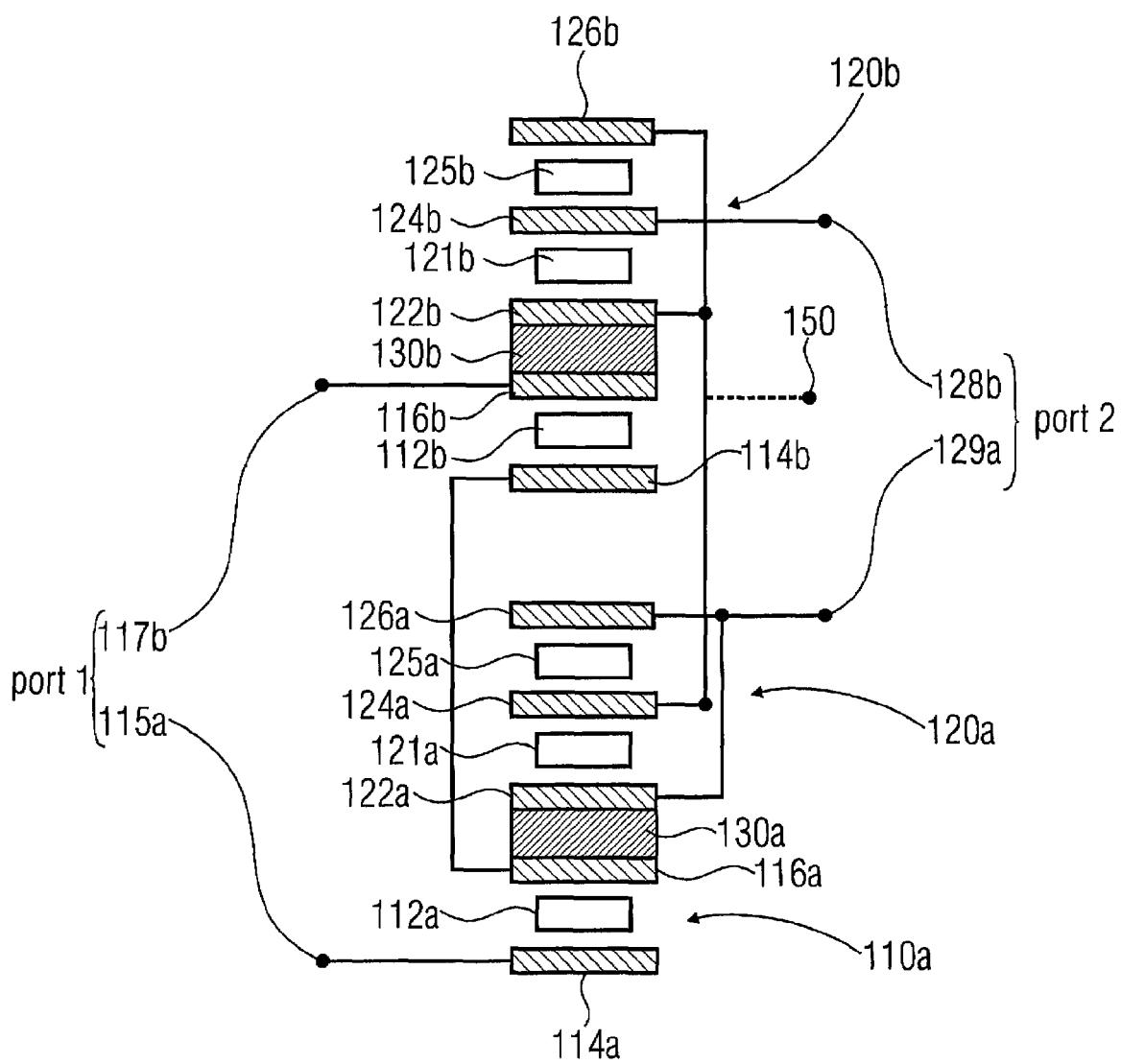

FIGS. 11a and 11b show two circuitries according to embodiments of the present invention in order to achieve a 2:1 impedance conversion.

FIG. 11a shows a circuitry between port 1 and port 2, wherein port 1 comprises the first terminal 115 and the second terminal 117 and port 2 comprises the second terminal 128 (fourth terminal in FIG. 9) and the first terminal 129 (fifth terminal in FIG. 9), wherein the first terminal 129 is connected to the third electrode 122. Therefore, port 1 is connected to the BAW resonator 110 and port 2 is connected to the SCF 120, where the BAW resonator 110 and the SCF 120 are separated by an acoustic coupling layer structure 130.

FIG. 11b shows a further circuitry for a Bulk Acoustic Wave Device, which is capable of a 2:1 impedance conversion for a signal transmitted between port 1 and port 2. The embodiment of FIG. 11b comprises a first BAW resonator 110a and a first SCF 120a arranged on opposite sides of the a first coupling layer 130a and, moreover, a second BAW resonator 10b and a second SCF 120b are arranged on two opposite sides of a second coupling layer 130b. The second electrode 116a of the first BAW resonator 110a is connected to the first electrode 114b of the second BAW resonator 110b. The fourth electrode 124a of the first SCF 120a is connected to the third electrode 122b and to the fifth electrode 126b of the second SCF 120b. The second electrode 116b of the second BAW resonator 110b comprise a second terminal 117b of a port 1 and the first electrode 114a of the first BAW resonator 110a comprise a first terminal 115a of the port 1. The third electrode 122a of the first SCF 120a and the fifth electrode 126a of the first SCF 120a are connected to a first terminal 129a of a port 2 and the fourth electrode 124b of the second SCF 120b is connected to a second terminal 128b of the port 2.

In a further embodiment, the fourth electrode 124a of the first SCF 120a and the third and fifth electrode 122b and 126b of the second SCF 120b are connected to a common electrode or center tap 150. The center tap 150 provides an additional terminal.

With this embodiment for a signal between port 1 and port 2 it is possible to achieve an impedance conversion with a ratio of 2:1. This is achievable, for example, by choosing the same geometry of the first and second BAW resonators 110a and 110b as well as the same geometry of the first and second SCF 120a and 120b. For example, contact areas of the first and second electrodes 114a and 116a of the first BAW resonator 110a with the first piezoelectric layer 112a comprise a first active area and further contact areas of the first and second electrodes 114b and 116b of the second BAW resonator 110b with the piezoelectric layer 112b comprise a second active area. Similarly, contact areas of the electrodes 122, 124 and 126 with the piezoelectric layers 121 and 125 of the first and second SCF 120a and 120b comprise a third and fourth active area, so that surface areas of the first, second, third and fourth active area coincide with a tolerance of ±20%, or of ±5%.

In further embodiments different BAW resonators and/or SCFs share common piezoelectric layers in that the BAW resonators and/or SCFs are formed at different sites of the common piezoelectric layer. For example, the first and second BAW resonators 110a and 110b can be formed at different sites of a first common piezoelectric layer. In the same way, the first and second SCFs 120a and 120b can be formed at different sites of a common double piezoelectric layer in the sense, that the first piezoelectric layers 121a and 121b of the first and second SCF 120a and 120b can be one piezoelectric layer 121 and the second piezoelectric layers 125a and 125b of the first and second SCF 120a and 120b can be one piezoelectric layer 125, where the electrodes 122a, 124a, 126 are formed at different sites than the electrodes 122b, 124b and 126b.

The circuitries as shown in FIGS. 11a and 11b are examples for the bulk acoustic wave device as shown in FIG. 9 and further combinations (with more BAW resonators and more SCFs) are possible. In further embodiments, the port 1 and port 2 may be exchanged, which implies, in turn, an exchange of the impedance conversion, for example, a 2:1 ratio can be exchanged to a 1:2 conversion ratio.

Figure 11C:
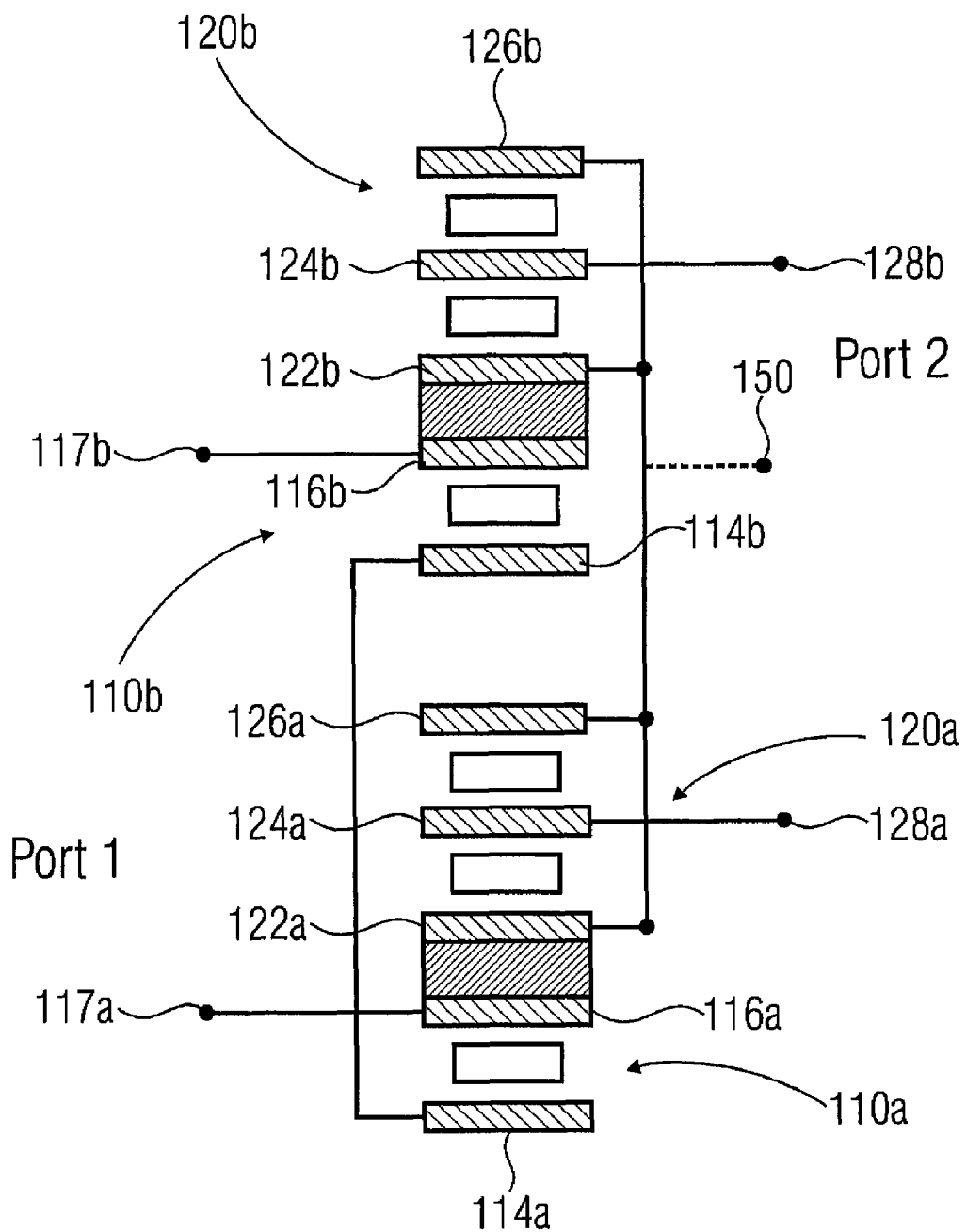

FIG. 11c shows a further circuitry for a bulk acoustic wave device, which is capable again of a 2:1 impedance conversion for a signal transmitted between port 1 and port 2. As the embodiment as shown in FIG. 11b, this further embodiment comprises a circuitry of two bulk acoustic wave devices as the one shown in FIG. 11a, that means the circuitry of FIG. 11c comprises a first BAW resonator 110a, a first SCF 120a, which are connected to a second BAW resonator 110b and a second SCF 120b. In contrast to the embodiment as shown in FIG. 11b, the first electrode 114a of the first BAW resonator 110a is connected to the first electrode 114b of the second BAW resonator 110b. Port 1 comprises again a first terminal 117a, which is now connected to the second electrode 116a of the first BAW resonator 110a, and a second terminal 117b is now connected to the second electrode 116b of the second BAW resonator 110b. On the other hand, the first electrode 122a and the third electrode 126a of the first SCF 120a are both connected to the first electrode 122b as well as to the third electrode 126b of the second SCF 120b. Optionally, these electrodes are connected to the center tap 150. The port 2 of the embodiment as shown in FIG. 11c comprises again a first terminal 128a, which is connected to the second electrode 124a of the first SCF 120a, and a second terminal 128b is connected to the second electrode 124b of the second SCF 120b.

Hence, in comparison to the embodiment as shown in FIG. 11b, the embodiment as shown in FIG. 1I c comprises less vias needed to connect electrodes. For example, the first electrodes 114a and 114b of the first and the second BAW resonators 110a and 110b are now connected and, similarly, the first electrodes 122a and 122b of the first and second SCFs 120a and 120b are connected to each other as the third electrodes 126a and 126b of the first and second SCFs 120a and 120b. If, for example, the first and the second BAW resonators 110a and 110b are arranged along a first common piezoelectric layer (at different sites of the first common piezoelectric layer) and if, similarly, the first and the second SCFs 120a and 120b are arranged at different sites of a second and a third common piezoelectric layers, the circuitry as shown in FIG. 11c comprises a simplified manufacturing process (since vias through the piezoelectric layers can be omitted).

As in the embodiment as shown in FIG. 11b, the center tap or common electrode 150 can be used with in the single to balanced mode conversion, that means the center tap 150 can be used, for example, as a ground electrode and the signals at first and second terminals 129a and 128b in FIG. 11b or 128a and 128b in FIG. 11c of port 2 are phase shifted by 180° relatively to each other.

Figure 11D:
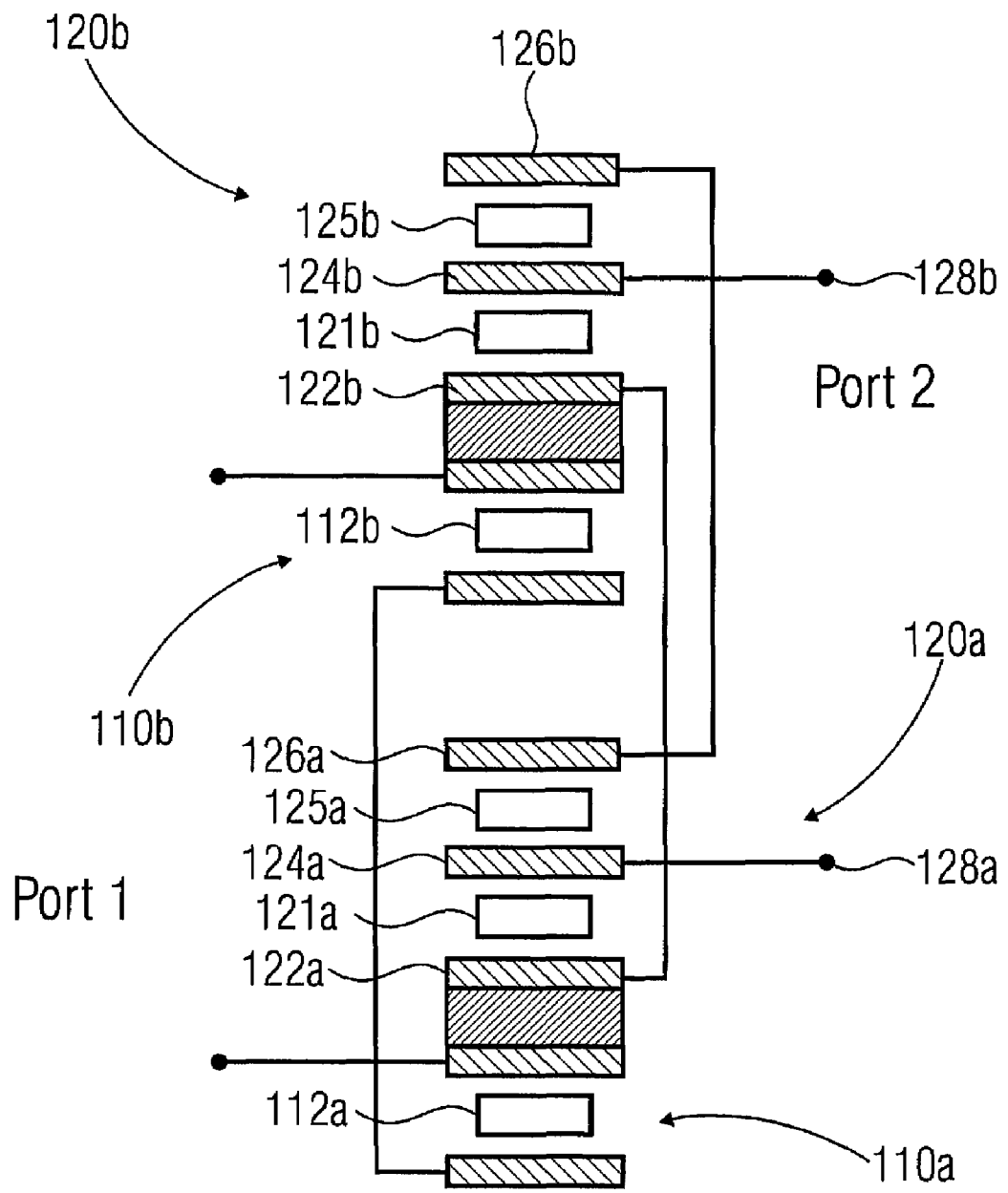

FIG. 11d shows yet another circuitry, in which even more vias through the second and third piezoelectric layers 121a, 125a of the first SCF 120a and the second and the third piezoelectric layer 121b and 125b of the second SCF 120b can be omitted. In difference to the embodiment as shown in FIG. 11c the first electrode 122a of the first SCF 120a is connected to the first electrode 122b of the second SCF 120b, and the third electrode 126a of the first SCF 120a is connected to the third electrode 126b of the second SCF 120b. In this embodiment the first and third electrodes 122a and 126a of the first SCF 120a are disconnected. The same holds for the first and third electrodes 122b and 126b of the second SCF 120b, which are disconnected. A center tap or common electrode 150 is absent in the embodiment as shown in FIG. 11d (in contrast to FIGS. 11b, c).

In case the first and second BAW resonators 110a and 110b are again arranged, for example, at different sites of a common first piezoelectric layer, electrodes on either side of the common first piezoelectric layer are connected in the embodiment as shown in FIG. 11d. Similarly, if the first and second SCFs 120a and 120b are also arranged at different sites of a common second piezoelectric layer and a common third piezoelectric layer, electrodes arranged between the common second and third piezoelectric layers comprises the first and second terminals of port 2 and the remaining electrodes of the opposite side of the common second piezoelectric layer and electrodes on the common third piezoelectric layers are connected with each other in a way that electrodes on a given side of the common second and third piezoelectric layers are connected with each other. Hence, the manufacturing process for the embodiment as shown in FIG. 11d is further simplified, because the complexity in implementation is reduced (no vias, for example), but at a cost of symmetry (for example, no center tap).

Figure 11E:
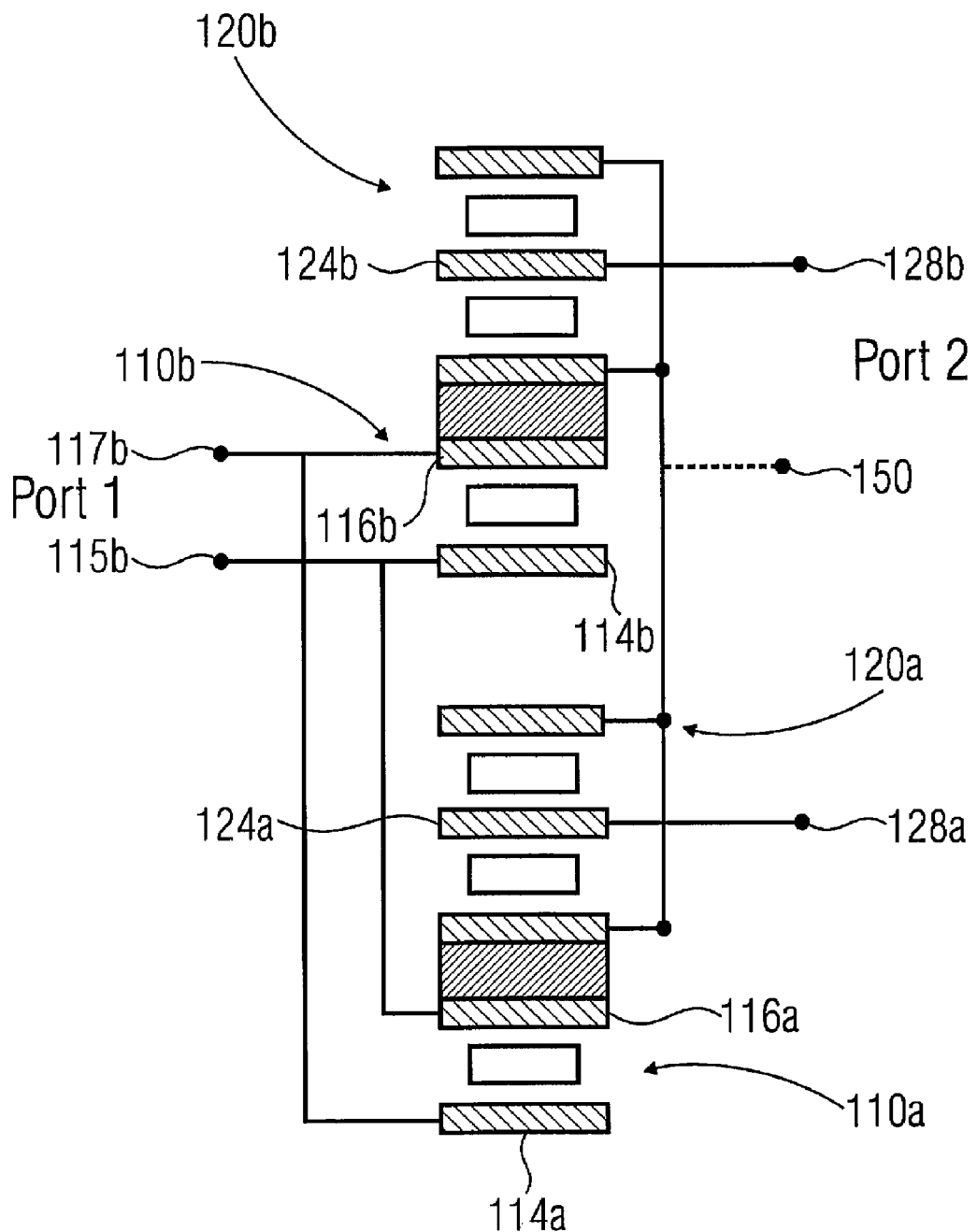

FIG. 11e shows an embodiment, in which the impedance conversion ratio is opposite to the ratio of the embodiment as shown in FIGS. 11b-11d. For example, for a signal transmitted between port 1 and port 2, the impedance conversion ratio of the embodiment as shown in FIG. 11e comprises a 1:2 ratio, compared to a 2:1 ratio in the former embodiments. Now, the first and the second BAW resonators 110a and 110b are connected in parallel, that means the port 1 comprises now a first terminal 115b, which is connected to both the first electrode 114b of the second BAW resonator 110b and to the second electrode 116a of the first BAW resonator 110a. The second terminal 117b of port 1 is connected to both the second electrode 116b of the second BAW resonator 110b and to the first electrode 114a of the first BAW resonator 110a. The connections between the electrodes of the first SCF 120a and the second SCF 120b are the same as the one shown in FIG. 1I c and a repeated description is omitted here. Hence, the opposite conversions ratio of the embodiment as shown in FIG. 11e compared to the embodiment as shown in FIG. 1I c, for example, is a consequence of the parallel connection of the first and the second BAW resonators 110a and 110b in FIG. 11e compared to a serial connection of the first and second BAW resonators 110a and 110b in FIG. 11c.

Again, in the embodiment as shown in FIG. 11b a center tap 150 is possible, which can, for example, be used as a ground for the balanced output signal. Port 2 comprises again a first terminal 128a connected to the second electrode 124a of the first SCF 120a and a second terminal 128b connected to the second electrode 124b of the second SCF 120b. Again, the first and the second BAW resonators 110a and 110b can be arranged along a common first piezoelectric layer and, similarly, the first and the second SCFs 120a and 120b can also be arranged along a common second piezoelectric layer and along a common third piezoelectric layer. The acoustic waves excited in the first and second BAW resonators 110a and 110b by a signal at port one are phase shifted by 180° and the output signal at the first terminal and the second terminal 128a and 128b at port 2 are also phase shifted by 180° with the center tap or common electrode 150 as ground (balanced output signal).

The embodiments as shown in FIGS. 11b, 11c and 11d can be generalized in the following way. A new port 1 can be obtained by a serial or parallel connections of the ports 1 (of the device of FIG. 11a) and a new port 2 can be obtained by a serial or parallel connection of the ports 2 (of the device of FIG. 11*a*). In FIGS. 11*b* and 11*c* the terminals of port 1 of the two bulk acoustic wave devices according to FIG. 11*a* are connected in series. In FIG. 11*e* the terminals of port 1 of the bulk acoustic wave device of FIG. 11*a* are connected in parallel. In both cases, the terminals of port 2 of FIG. 11*a* are connected in series in the embodiments as shown in FIGS. 11*b*, 11*c* and 11*e*. Therefore, a resulting system comprises a first bulk acoustic wave device according to FIG. 11*a*, a second bulk acoustic wave device according to FIG. 11*a*, a first system port provided by a serial or a parallel connection of the first ports of the first and second bulk acoustic wave devices and a second system port provided by a parallel or serial connection of the second ports of the first and second bulk acoustic wave devices. Whenever, one of the system ports comprises a serial connection of two terminals (of the BAW device of FIG. 11*a*), a common electrode or center tap can be formed in-between the two terminals.

The embodiments as shown in FIGS. 11*b* to 11*e* can be modified in the sense that the bulk acoustic wave devices as shown in FIG. 11*a* are not used for serial or parallel connections, but instead bulk acoustic wave devices as shown in FIG. 9 are used. Thereby, a system port 1 can be obtained by a serial or parallel connections of a first port and a second port, wherein the first port comprise the first and second terminals of the first BAW resonator 110*a* and the second port comprises the first and second terminal of the second BAW resonator 110*b*. A system port 2 comprises a first terminal and a second terminal, wherein the first terminal of the system port 2 is one terminal of the third, fourth or the fifth terminals 127*a*, 128*a* or 129*a* of the first SCF 120*a*, and wherein the second terminal of the system port 2 is one terminal of the third, fourth or the fifth terminal 127*b*, 128*b* or 129*b* of the second SCF 120*b*. Another terminal of the third, fourth or the fifth terminals 127*a*, 128*a* or 129*a* of the first SCF 120*a* is connected with another terminal of the third, fourth or the fifth terminals 127*b*, 128*b* or 129*b* of the second SCF 120*b*. Similarly, a remaining terminal of the third, fourth or the fifth terminals 127*a*, 128*a* or 129*a* of the first SCF 120*a* is connected with a remaining terminal of the third, fourth or the fifth terminals 127*b*, 128*b* or 129*b* of the second SCF 120*b*. Hence, this more general embodiment encloses the embodiments as shown in the FIG. 11*d*, which is described above, as special case.

There are even more general interconnections between a first and second bulk acoustic wave devices as shown in FIG. 9 possible. They can be constructed in the following way. In total there are 10 terminals, the first, second, third, fourth and fifth terminal 115*a*, 1117*a*, 127*a*, 128*a* and 129*a* of the first BAW device, which are combined with the first, second, third, fourth and fifth terminal 115*b*, 117*b*, 127*a*, 128*b* and 129*b* of the second BAW device. Each of these ten terminals can be interconnected with one or more of the remaining terminals and/or to a further terminal, wherein the further terminal is one of the terminals of the system port 1 or the system port 2. In other words, the first and/or second and/or third and/or fourth and/or fifth terminal of the first BAW device and/or the first and/or second and/or third and/or fourth and/or fifth terminal of the second BAW device are interconnected and/or are connected with the further terminal. Each of the system port 1 and 2 can, in general, comprise two or more terminals. This yields many possible connections, wherein some of them comprise a short circuit, e.g., between terminals of the system port 1 and system port 2. However, these interconnections can be neglected.

In these embodiments the first and second BAW resonators 110*a* and 110*b* and the first and second SCFs 120*a* and 120*b* comprises a same resonator area (the resonator area being the area, over which the corresponding piezoelectric layer is sandwiched by electrodes). In addition, the first, second and third piezoelectric layers 112, 121 and 125 comprise, for example, a same piezoelectric orientation and a same piezoelectric material. In further embodiments, this does not need to be the case, so that variations of the resonator areas, as well as piezoelectric materials, are possible.

Figure 12:
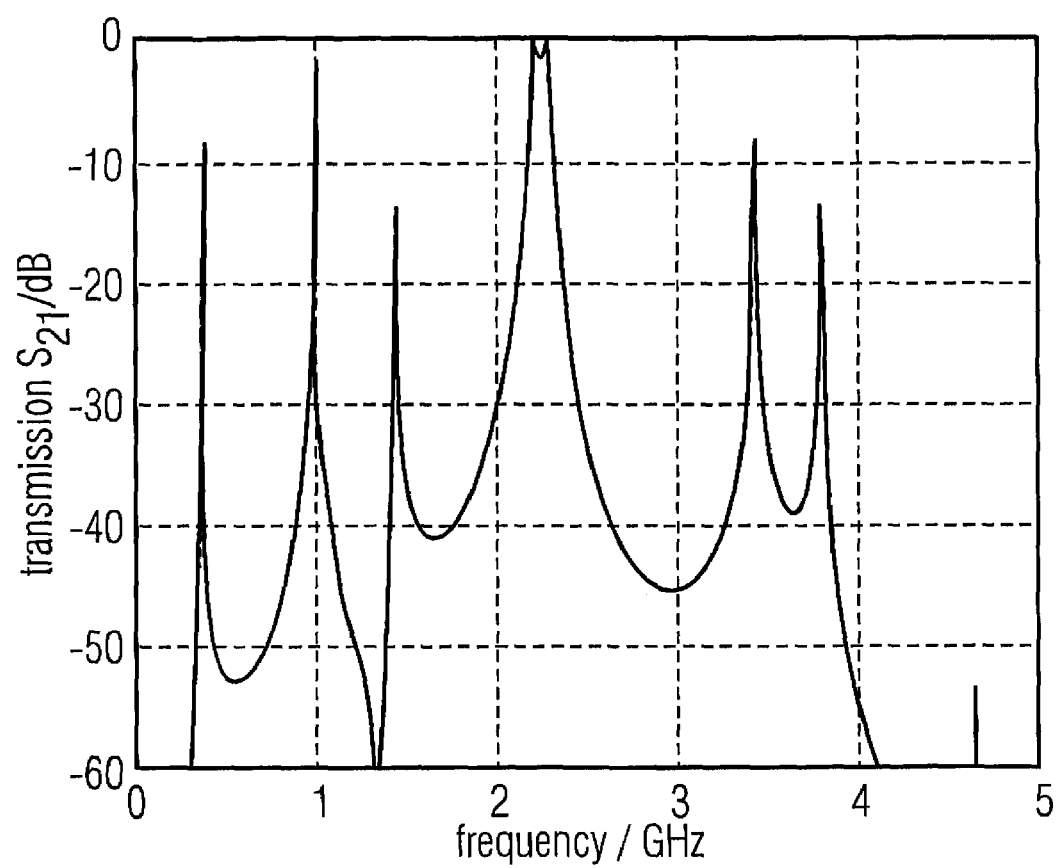
FIG. 12 shows a wide band transfer function for a stack without a center tap.

FIG. 12 shows a wide band transfer function for a stack without a center tap 150. It shows a graph for a transmission $S_{21}$ (attenuation again measured in dB) as a function of the frequency measured in GHz. This graph is obtained, for example, by a simulation for a membrane device, that means without an acoustic mirror. The transmission $S_{21}$ shows various resonance peaks (maxima), a first one at around 0.5 GHz, a second one at around 1 GHz, a third one at around 1.5 GHz, a fourth one at around 3.4 GHz, a fifth one at around 3.8 GHz and a sixth one at around 4.6 GHz. In the frequency range between 2.2 and 2.3, the graph shows a wide band, where a signal is transmitted with almost no loss (almost vanishing attenuation). As the graph shown in FIG. 7*b*, the passband comprises two maxima with a small minimum in between and the characteristics as shown in the graph of FIG. 12 can be achieved by circuitries as explained with the FIGS. 11*a* and 11*b*.

Figure 13:
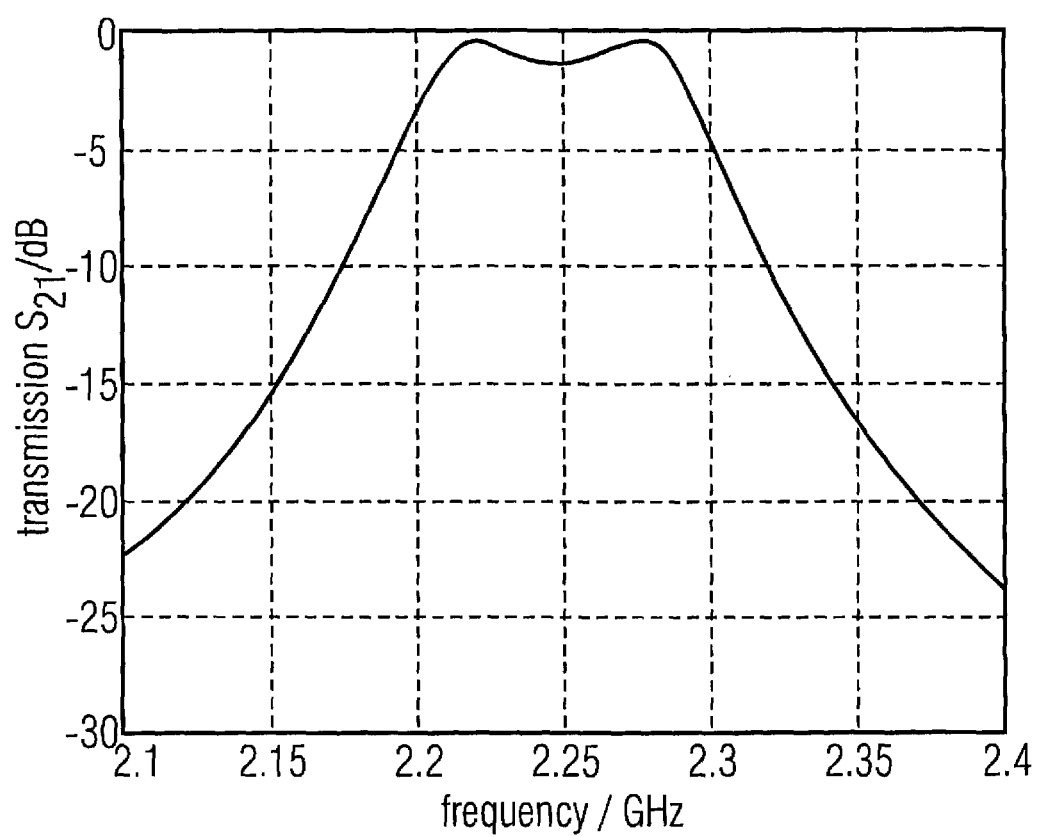

FIG. 13 shows another passband transfer function for a stack without a center tap 150 as shown in FIG. 11*a*. A graph is, again, shown for the transmission $S_{21}$ (attenuation measured in dB) as a function of the frequency within the range between 2.1 GHz and 2.4 GHz. The graph comprises two maxima, one maximum at around 2.22 GHz and another maximum at around 2.28 GHz. Between the two maxima, the graph shows a weak minimum (that means the transmission $S_{21}$ difference between the maximum and minimum is, for example, less than 5 dB) and for frequencies below the first maximum, the graph is monotonically increased and for frequencies above the second maximum, the graph is monotonically deceased. The passband is around the central frequency of around 2.25 GHz and the transmission is symmetrically around this central frequency.

Figure 14:
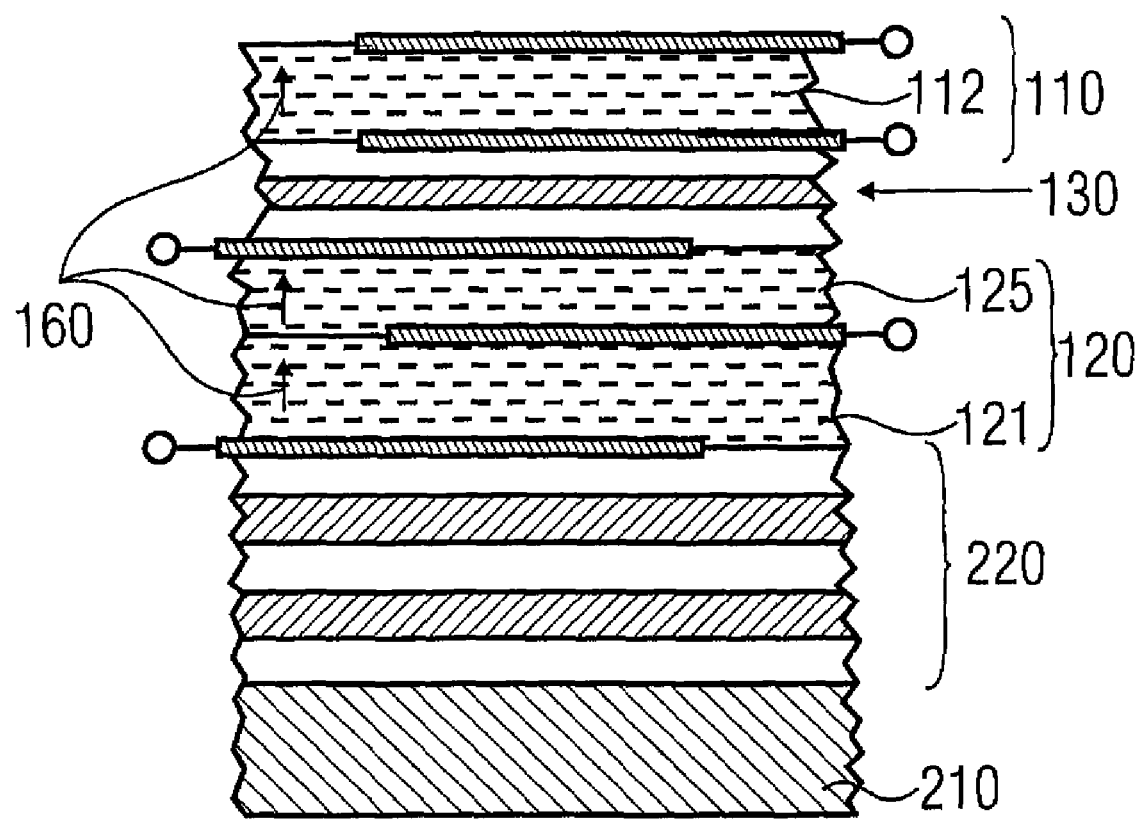
FIG. 14 shows a cross-sectional view of an inverted structure.

FIG. 14 shows an inverted structure for a Bulk Acoustic Wave device, wherein in comparison to the embodiment as shown in FIG. 9, the SCF 120 is arranged between the substrate 210 with the acoustic mirror 220 and the acoustic coupling layer structure 130. In this embodiment, the BAW resonator 110 is arranged on top of the acoustic coupling layer structure 130 (opposite to the substrate 210). Apart from exchanging the BAW resonator 110 with the SCF 120, the structure is the same as the one shown in FIG. 9 and, hence, a repeated description is omitted here. As in the embodiment shown in FIG. 9, also here the piezoelectric layers 112, 121, 125 comprise the same piezoelectric 160, which may be arranged perpendicular to lateral extensions of the layer assembly.

Figure 15:
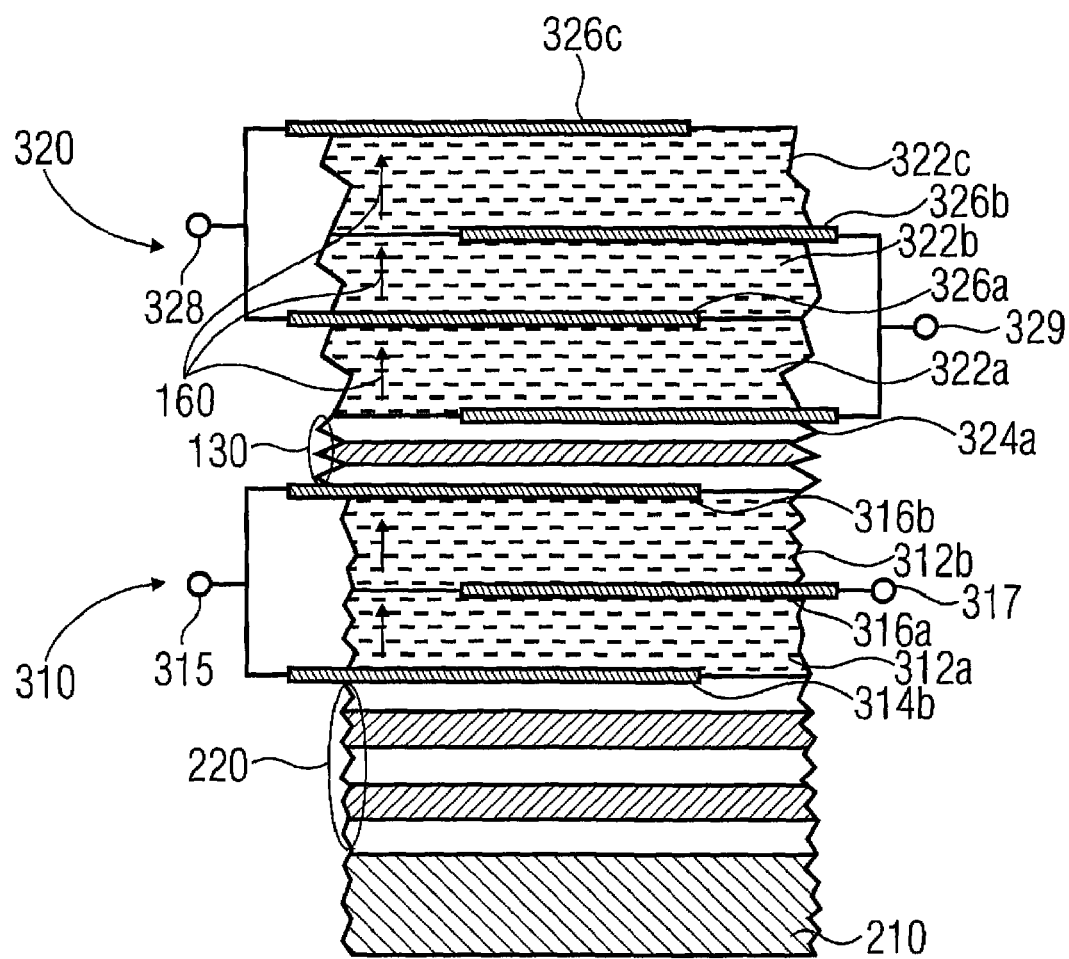
FIG. 15 shows another embodiment comprising a stacked arrangement of a SCF and an extended stacked crystal filter.

FIG. 15 shows a further embodiment of the present invention, which allows a impedance conversion ratio of 2:3 and which comprises a stacked arrangement of a SCF 310 and an extended stacked crystal filter (eSCF), which are arranged on opposite sides of the coupling layer structure 130. The stacked arrangement is such, that the SCF 310 is formed between the coupling layer structure 130 and the substrate 210 with the acoustic mirror 220.

The SCF 310 comprises a first electrode 314*a* formed on the acoustic mirror 220, a first piezoelectric layer 312*a* formed at least partially on the first electrode 314*a*, a second electrode 316*a* formed at least partially on the first piezoelectric layer 312*a*, a second piezoelectric layer 312*b* formed at least partially on the second electrode 316*a* and a third electrode 316b formed at least partially on the second piezoelectric layer 312b. The first and third electrode 314a and 316b are connected to a first terminal 315 and the second electrode 316a is connected to a second terminal 317.

The eSCF 320 comprises a first electrode 324a formed at least partially on the coupling layer structure 130, a first piezoelectric layer 322a formed at least partially on the first electrode 324a, a second electrode 326a formed at least partially on the first piezoelectric layer 322a, a second piezoelectric layer 322b formed at least partially on the second electrode 326a, a third electrode 326b formed at least partially on the second piezoelectric layer 322b, a third piezoelectric layer 322c formed at least partially on the third electrode 326b and a fourth electrode 326c formed at least partially on the third piezoelectric layer 322c. The first and third electrodes 324a and 326b are connected to a first terminal 329 and the second and fourth electrode 326a and 326c are connected to a second terminal 328.

The orientations of the piezoelectric layers 312a, 312b, 322a, 322b, and 322c are again aligned with each other and are, for example, perpendicular to lateral extensions of the plurality of electrodes as indicated by the arrows 160. The first and second piezoelectric layers 312a and 312b of the SCF 310 is equivalent to two BAW resonators, which are acoustically coupled and electrically connected in parallel. Similarly, the first, second, and third piezoelectric layers 322a, 322b, and 322c of the eSCF 310 is equivalent to three BAW resonators, which are acoustically coupled and electrically connected in parallel. Hence, admittances of these BAW resonators add up at a port 1 (comprising the first and second terminals 315, 317) and port 2 (comprising the first and second terminals 329, 328) yielding a conversion ration of 2:3.

In order to obtain the conversion ration during operation, in the SCF 310 the first harmonic excitation (first harmonic overtone) and in the eSCF 320 the second harmonic excitation (second harmonic overtone) are excited. This means that in the SCF 310 a full wave length of an acoustic wave is excited, whereas in the eSCF 320 three half of a full wave length is excited. In further embodiments, again the orientations of the piezoelectric layer be can changed, for example, in the opposite direction as indicated by the arrows 160, while still being aligned along one direction. This BAW-device can also be extended in order to achieve further impedance conversion ratios.

FIGS. 16a to 16d show embodiments for any rational impedance conversion ratio.

Figure 16A:
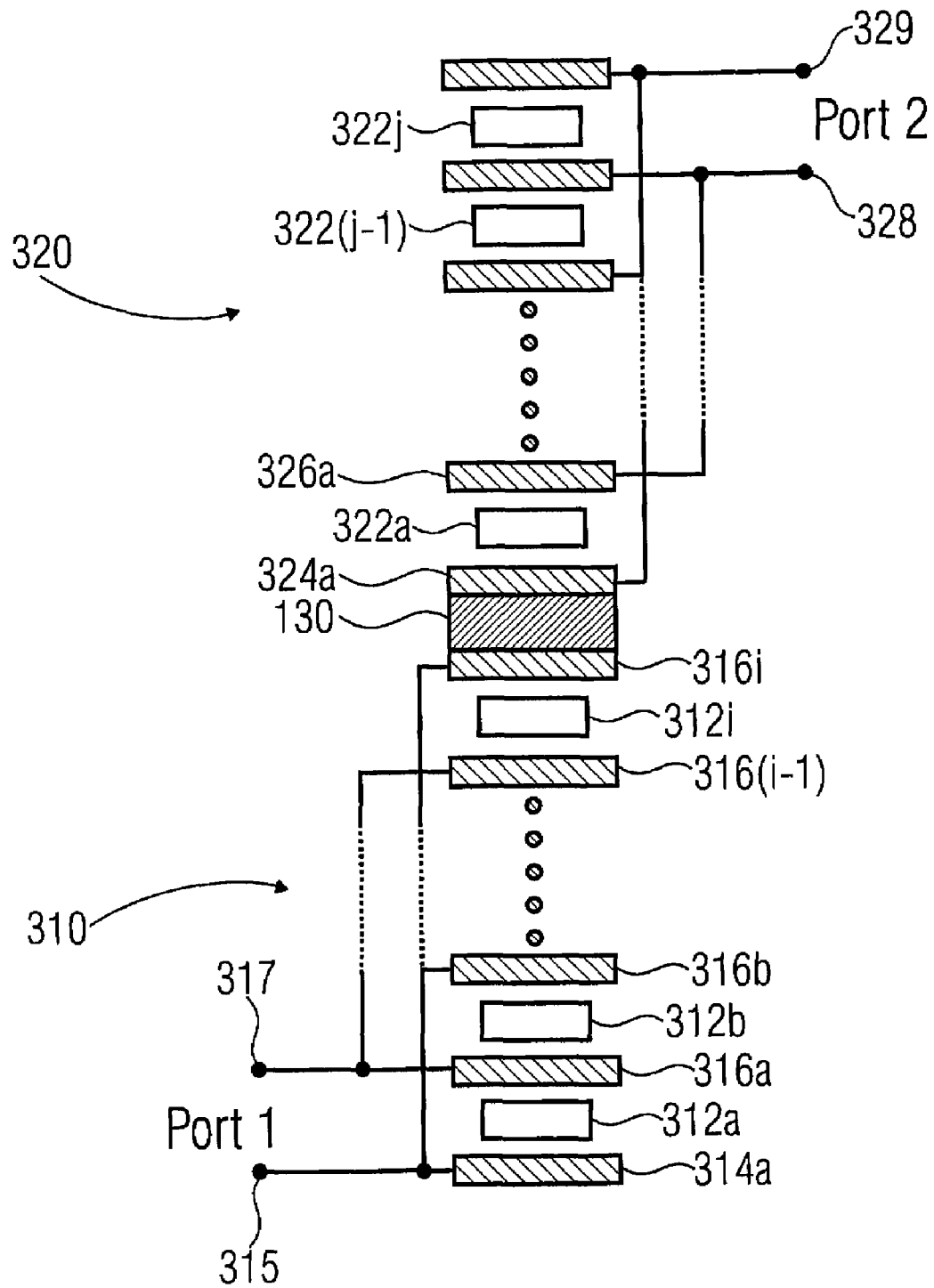
FIGS. 16a-16d show further embodiments comprising a stacked arrangement of two extended stacked crystal filter for general rational impedance conversion ratios.

FIG. 16a shows an embodiment with a impedance conversion ratio of equal numbers, that means a ratio of 2m:2n with m,n=1, 2, 3, . . . , obtained by a stacked arrangement of two extended stacked crystal filters, a first eSCF 310 and a second eSCF 320, arranged on opposite sides of the coupling layer structure 130. The first eSCF 310 comprises an equal number of piezoelectric layers, a first piezoelectric layer 312a, a second piezoelectric layer 312b, . . . up to an $i^{th}$ piezoelectric layer 312i, where "i" is an even number and the counting is done in a way that the last element is closest to the coupling layer structure 130. Between adjacent piezoelectric layers, electrodes are arranged, that means the first piezoelectric layer 312a is sandwiched between a first electrode 314a and a second electrode 316a and the second piezoelectric layer 312b is sandwiched between the second electrode 316a and a third electrode 316b. This arrangement continues until the $i^{th}$ piezoelectric layer 312i, which is sandwiched between an $(i-1)^{th}$ electrode 316(i-1) and an $i^{th}$ electrode 316i. The odd electrodes, that means the first electrode 314a, the third electrode 316b and so on, are connected to a terminal 315, whereas the even electrodes (the second electrode 316a, the fourth electrode, and so on) are connected to a second terminal 317, wherein the first terminal 315 and the second terminal 317 provide a first port (port 1).

In the same way, the second eSCF 320 is formed by an even number of piezoelectric layers, a first piezoelectric layer 322a, . . . , an $(j-1)^{th}$ piezoelectric layer 322(j-1), a $j^{th}$ piezoelectric layer 322j, where j is an even number and the counting is such that the first element is closest to the coupling layer structure 130. As before, each piezoelectric layer is sandwiched by electrodes, wherein the odd electrodes, that means the first electrode 324a, the third electrode, and so on, are connected to a first terminal 329 and the even electrodes, that means the second electrode 326a, the fourth electrode and so on, are connected to a second terminal 328. The first and second terminal 329 and 328 provide a second port (port 2).

As in the embodiments before, the piezoelectric layers within the first eSCF 310 comprise a same piezoelectric orientation and the piezoelectric layers within the second eSCF 320 comprise also a same piezoelectric orientation, which may or may not be the same as for the first eSCF 310. During operation the acoustic waves excited in the first and second eSCF 310 and 320 are higher harmonics (higher harmonic overtones). For example, if the even number of piezoelectric layers in the first eSCF 310 is 2m, then the acoustic wave being excited in the first eSCF 310 comprises m wave lengths and in the same way the acoustic wave being excited in the second eSCF 320 comprises n wave lengths, if the second eSCF 320 comprises 2n piezoelectric layers.

Figure 16B:
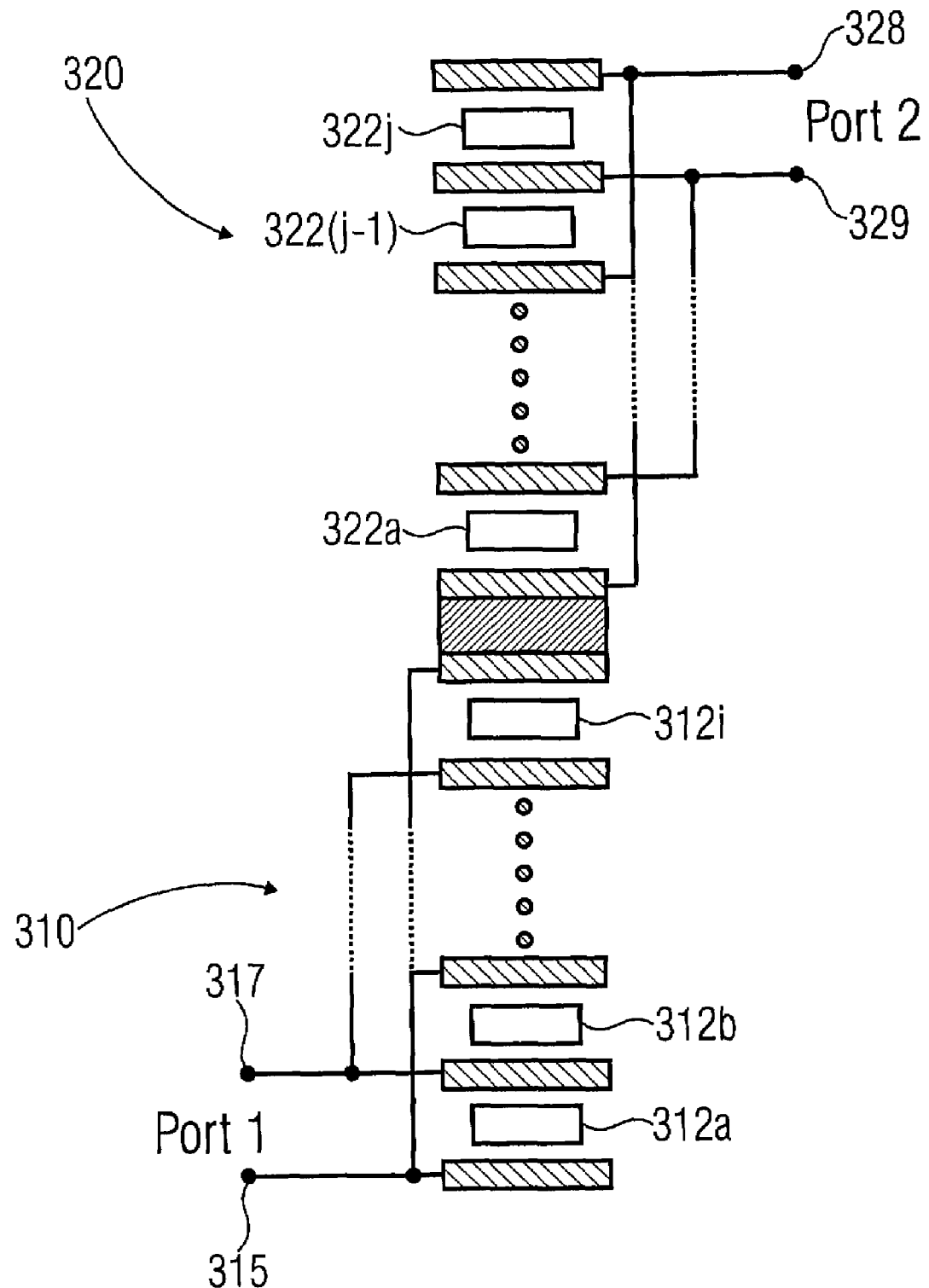
Figure 16C:
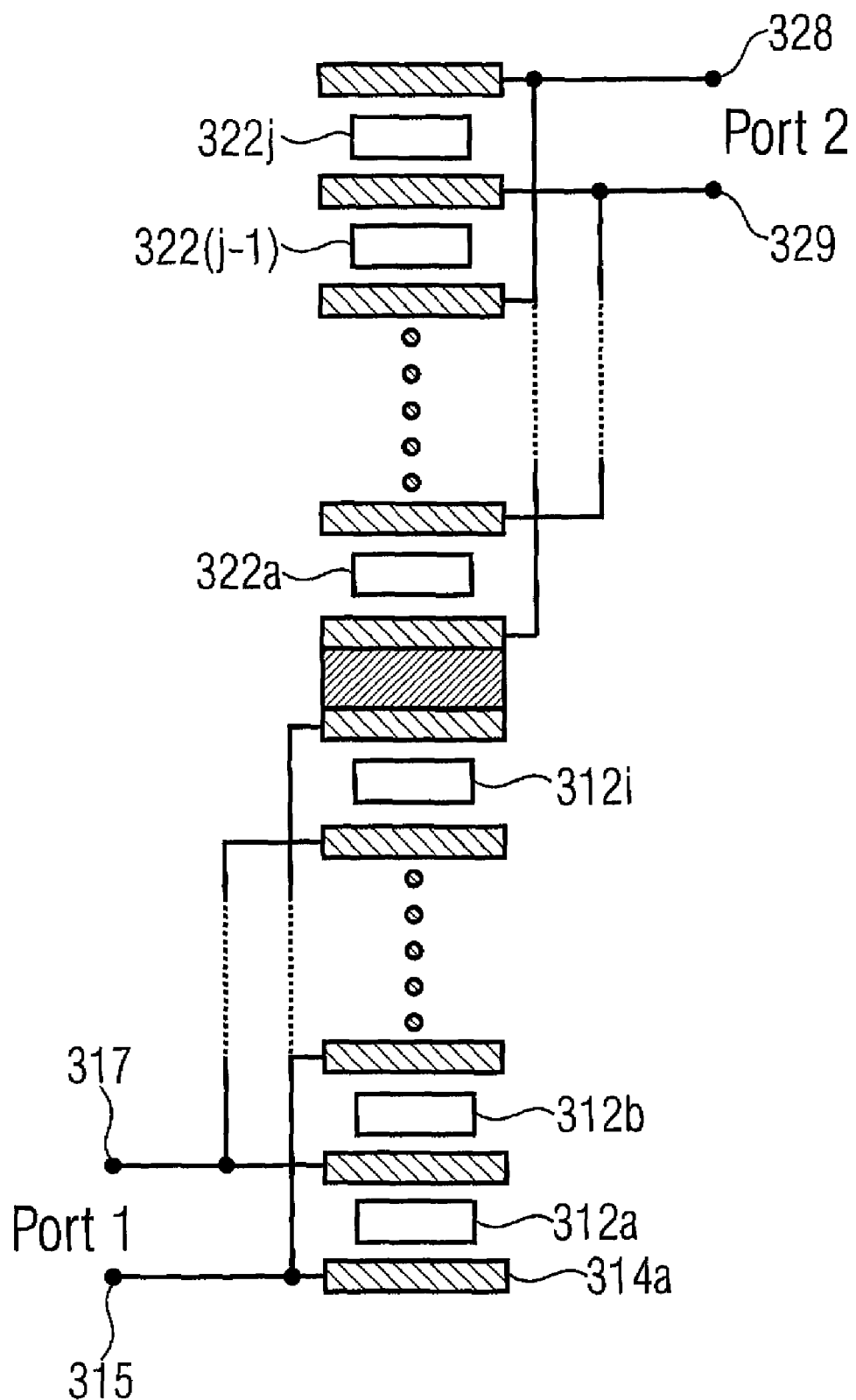
Figure 16D:
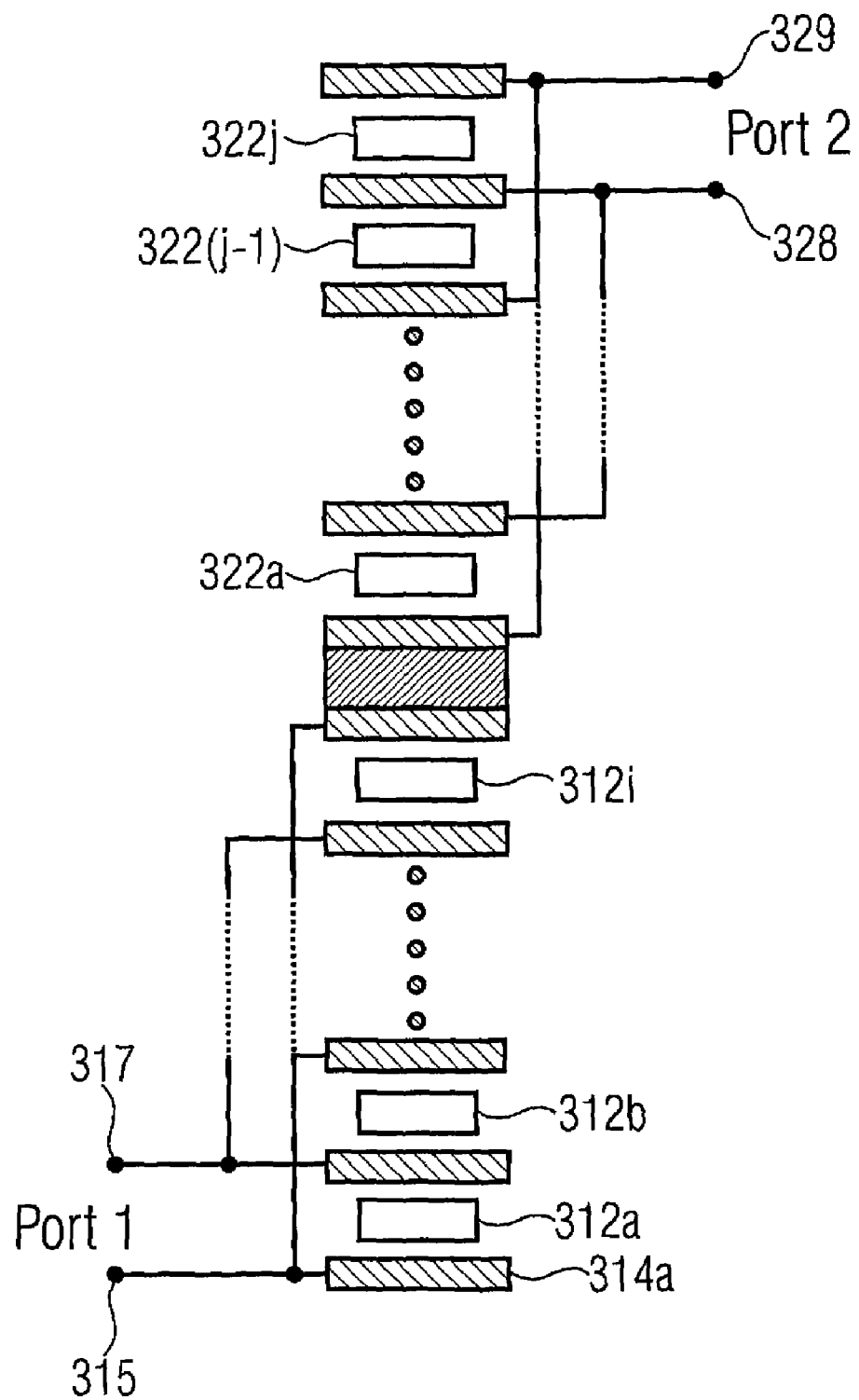

FIGS. 16b to 16d comprise generalizations of the embodiment as shown in FIG. 16a in the sense that the numbers of piezoelectric layers can also be odd.

In particular, in FIG. 16b the first eSCF 310 comprises an odd number of piezoelectric layers, a first piezoelectric layer 312a, a second piezoelectric layer 312b, . . . up to an $i^{th}$ piezoelectric layer 312i, where "i" being an odd number here and the counting is done in a way that the last element is closest the coupling layer structure 130. The second eSCF 320 comprises also an odd number of piezoelectric layers, a first piezoelectric layer 322a, . . . , $(j-1)^{th}$ piezoelectric layer 322(j-1), an $j^{th}$ piezoelectric layer 322j, where "j" being an odd number here and the counting is done in a way that the first element is closest the coupling layer structure 130. Each piezoelectric layer is again sandwiched by electrodes, wherein the odd electrodes of the first eSCF 310 are connected to a first terminal 315 and the even electrodes of the first eSCF 310 are connected to a second terminal 317. In the similar way, the odd electrodes of the second eSCF 320 are connected to a first terminal 329 and the even electrodes of the second eSCF 320 are connected to a second terminal 328.

The embodiment as shown in FIG. 16c comprises a first eSCF 310 with an even number of piezoelectric layers 312a, 312b, . . . , 312i (i is an even number) and a second eSCF with an odd number of piezoelectric layers 322a, . . . , 322(j-1), 322j ("j" being an odd number here), whereas the embodiment in FIG. 16d shows the opposite situation, where the first eSCF 310 comprises an odd number of piezoelectric layers 312a, 312b, . . . , 312i ("i" being an odd number here) and the second eSCF 320 comprises an even number of piezoelectric layers 322a, . . . , 322(j-1), 322j ("j" being an even number here). Again, all piezoelectric layers are sandwiched by electrodes, whereas the even electrodes (counted from the first electrodes 314a of the first eSCF 310) are connected to the second terminal 317 of the first port and the odd electrodes are connected to the first terminal 315. In the same way, the even electrodes of the second eSCF 320 are connected to a second terminal 328 of the second port and the odd electrodes are connected to a first terminal 329 of the second port.

As discussed in the context of FIG. 16a, all piezoelectric layer within an eSCF (within the first eSCF 310 and within the second eSCF 320) can comprise a same orientation and therefore, during operation a higher harmonic overtone is excited, wherein the number of piezoelectric layers can coincide with the number of half the wavelength of the acoustic wave being excited. For example, for three piezoelectric layers 3/2 of a wavelength, for four piezoelectric layers 2 wavelengths, for five piezoelectric layers 5/2 of a wavelength and so on. In further embodiments the orientations of the piezoelectric layers can also be alternating in opposite directions so that also a principle mode of the acoustic wave can be excited.

The embodiments as shown in FIG. 16a-d are special examples for connecting two eSCFs and in further embodiments the interconnections are different. An eSCF comprises in general "j" piezoelectric layers and "j+1" electrodes sandwiching the "j" piezoelectric layers and offers various possibilities for connecting two eSCFs. For example, a first eSCF comprises "j" piezoelectric layers and "j+1" electrodes sandwiching the "j" piezoelectric layers and a second eSCF comprises "i" piezoelectric layers and "i+1" electrodes sandwiching the "i" piezoelectric layers. Hence, in total the bulk acoustic wave device comprises "i+j+2" electrodes, wherein one or more electrodes of the "i+j+2" electrodes can be connected with one of the terminals of a first or a second port. In addition, the "i+j+2" electrodes are interconnected with each other. For example, a first plurality of electrodes of the "i+j+2" electrodes can be interconnected, a second plurality of electrodes of the "i+j+2" electrodes can be interconnected and so on (wherein a plurality can comprise two, three, four or more electrodes).

In other words, each of these "i+j+2" electrodes can be interconnected with one or more of the remaining electrodes and/or to a terminal, wherein the terminal is one of the terminals of the first or second port. Each of the first and second port can moreover comprise two or more terminals. This yields many possible interconnections, wherein some of them comprise a short circuit, e.g., between terminals of the first and second port. These interconnections can, however, be neglected.

Since various pluralities of electrodes can be interconnected, this involves many possibilities of connections. The embodiments as shown in the FIG. 16a-d are only simple examples, which are special cases of this more general circuitry.

Yet another embodiment comprises interconnections of a first and a second set of acoustically coupled eSCFs as shown in FIGS. 16a-16d in a similar way as the embodiments as shown in FIGS. 11b-11e. A new port 1 can be obtained by a serial or parallel connections of the ports 1 (of the devices of FIGS. 16a-16d) and a new port 2 can be obtained by a serial or parallel connection of the ports 2 (of the devices of FIGS. 16a-16d). Therefore, a resulting system comprises a first bulk acoustic wave device according to FIGS. 16a-16d, a second bulk acoustic wave device according to FIGS. 16a-16d, a first system port provided by a serial or a parallel connection of the first ports of the first and second bulk acoustic wave devices and a second system port provided by a parallel or second bulk acoustic wave devices. Whenever, one of the system ports comprises a serial connection of two terminals (of the BAW device of FIGS. 16a-16d), a common electrode or center tap can be formed in-between the two terminals.

These embodiments can be generalized in the following way. In this case, the first set comprises a first and second eSCF with "i+j+2" electrodes, which are acoustically coupled and the second set comprises a first and second eSCF with "n+m+2" electrodes, which are also acoustically coupled. Hence, there is a plurality of "i+j+n+m+4" electrodes, which can be interconnected in any possible way or are connected with a terminal of the first and second system port. Therefore, each electrode of the plurality of ("i+j+n+m+4") electrodes can be connected with at least one electrode of the remaining electrodes of the plurality of electrodes (or with a terminal of one of the system ports). In order to avoid vias (e.g., through the acoustic coupling layer) and for the case that the first and second acoustically coupled eSCF contains the same total number "k" of electrodes (k=n+m and k=i+j) it is advantageous to interconnect electrodes at the same position within the layer stack, i.e., the jth electrode out of the k electrodes of the first acoustically coupled eSCFs with the jth electrode of the k electrodes of the second acoustically coupled eSCFs. Thereby, the numbering of the electrodes of the first and second acoustically coupled eSCF is identical. This is especially advantageous if the acoustically coupled eSCFs are formed on a common substrate and the electrodes, piezo and coupling layers are formed by the same processing steps. Again connections can be established in many ways.

Possible materials for layers with high acoustic impedance comprise, for example: W, Mo, Pt, Ta, TiW, TiN, Ir, WSi, Au, $Al_2O_3$, SiN, $Ta_2O_5$ and zirconium-oxide, wherein the last four are dielectrical materials. Possible materials for the piezoelectric layers are, for example, AlN, ZnO, PZT and $LiNbO_3$. Materials for lower acoustic impedance are, for example, aluminum and silicon dioxide.

Some aspects of the embodiments can also be summarized as follows. An embodiment comprises an apparatus comprising a stacked crystal filter 120 and a bulk acoustic wave resonator 110 in a stacked arrangement. The SCF and the BAW resonator 110 are acoustically coupled. A coupling layer structure 130 arranged between the bulk acoustic wave resonator 110 and the stacked crystal filter 120 defines the acoustic coupling. The apparatus can moreover comprise a substrate comprising an acoustic mirror 220 such that the bulk acoustic wave resonator 110 and the stacked crystal filter 120 are formed on the acoustic mirror 220, the acoustic mirror 220 comprises an arrangement of layers of alternating high and low acoustic impedances. Alternatively, the apparatus comprises a membrane region. More generally, the substrate can be any means for supporting a first means for BAW-filtering and a second means for BAW-filtering such that a vibration within the first means and the second means for BAW filtering is substantially not hindered.

In further embodiments a bulk acoustic wave device comprises a first and a second port and, moreover, first, second, and third piezoelectric layers 112, 121, 125, which are dimensioned such that a ratio of an impedance at the first port to an impedance at the second port comprises a predetermined value. The predetermined value can, for example, be 2:1 or 1:2. The bulk acoustic wave device can also comprise a substrate 210 comprising an acoustic mirror 220, the second resonator 120 and the first resonators 110 are formed on the acoustic mirror 220, or the bulk acoustic wave device comprising a membrane region. The first resonator 110 and the second resonator 120 in the bulk acoustic wave device can be provided in a stacked arrangement.

Embodiments also comprise an apparatus comprising a first bulk acoustic wave device and a second bulk acoustic wave device. The apparatus comprises moreover a first system port provided by a serial or a parallel connection of the first ports of the first and second bulk acoustic wave devices. A second system port of the apparatus is provided by a serial connection of the second ports of the first and second bulk acoustic wave devices. The first and second bulk acoustic wave devices can be dimensioned such that a ratio of an impedance at the first system port to an impedance at the second system port is 2:1 or 1:2

Embodiments also comprise an apparatus comprising two bulk acoustic wave devices, e.g., a first bulk acoustic wave device and a second bulk acoustic wave device (e.g., as the one shown in FIG. 9). A first system port of the apparatus comprises a first plurality of terminals and a second system port comprising a second plurality of terminals, wherein the first and/or second and/or third and/or fourth and/or fifth electrode of the first bulk acoustic wave device and/or the first and/or second and/or third and/or fourth and/or fifth electrode of the second bulk acoustic wave device are interconnected and/or are connected with one terminal of the first and second plurality of terminals.

Yet another embodiment comprises a filter comprising a stacked SCF 120 and a bulk acoustic wave resonator 110, the filter comprises a first electrode 114, a first piezoelectric layer 112 formed at least partially on the first electrode 114, and a second electrode 116 formed at least partially on the first piezoelectric layer 112. The stacked crystal filter 120 comprises a third electrode 122, a second piezoelectric layer 121 formed at least partially on the third electrode 122, a fourth electrode 124 formed at least partially on the second piezoelectric layer 121, a third piezoelectric layer 125 formed at least partially on the fourth electrode 124, and a fifth electrode 126 formed at least partially on the third piezoelectric layer 125. A coupling layer structure 130 can be arranged between the bulk acoustic wave resonator 110 and the stacked crystal filter 120. The first port of the filter comprises, for example, a first terminal and a second terminal and the second port comprises a first terminal and a second terminal, wherein the first electrode 114 is connected to the first terminal of the first port, and the second electrode 116 is connected to the second terminal of the first port, and the fourth electrode 124 is connected to the first terminal of the second port, and the third electrode 122 and the fifth electrode 126 are connected to the second terminal of the second port. The first, second, and third piezoelectric layers 112, 121, 125 of the filter can be dimensioned such that a ratio of an impedance at the first port to an impedance at the second port output port has a predetermined value. The predetermined value can be 2:1 or 1:2. In addition, the filter can comprise a substrate 210 comprising an acoustic mirror 220, the bulk acoustic wave resonator 110 and the stacked crystal filter 120 are formed on the acoustic mirror 220, or the filter comprising a membrane region. The stacked crystal filter 120 and the bulk acoustic wave resonator 110 can be provided in a stacked arrangement in the filter.

What is claimed is:

1. An apparatus, comprising:
    a first bulk acoustic wave device;
    a second bulk acoustic wave device;
    a first system port provided by a serial or a parallel connection of first ports of the first and second bulk acoustic wave devices; and
    a second system port provided by a serial or a parallel connection of second ports of the first and second bulk acoustic wave devices, wherein the first bulk acoustic wave device and the second bulk acoustic wave device each respectively comprise:
    a first resonator comprising a first electrode, a first piezoelectric layer disposed at least partially on the first electrode, a second electrode disposed at least partially on the first piezoelectric layer;
    a first stack crystal filter comprising a third electrode, a second piezoelectric layer disposed at least partially on the third electrode, a fourth electrode disposed at least partially on the second piezoelectric layer, a third piezoelectric layer disposed at least partially on the fourth electrode, a fifth electrode disposed at least partially on the third piezoelectric layer;
    a coupling layer structure disposed between the first resonator and the first stack crystal filter;
    a first port comprising a first terminal and a second terminal; and
    a second port comprising a first terminal and a second terminal,
    wherein the first electrode is coupled to the first terminal of the first port, and the second electrode is coupled to the second terminal of the first port, and
    wherein the fourth electrode is coupled to the first terminal of the second port, and the third electrode and the fifth electrode are coupled to the second terminal of the second port.

2. The apparatus according to claim 1, wherein the first and second bulk acoustic wave devices are dimensioned such that a ratio of an impedance at the first system port to an impedance at the second system port is about 2:1 or about 8:1.

3. The apparatus according to claim 1, wherein the second system port is provided by the serial connection of the second ports of the first and second bulk acoustic wave devices, the serial connection comprising a common electrode between the second ports of the first and second bulk acoustic wave devices.

4. The apparatus according to claim 1,
    wherein the first system port is provided by the serial connection of the first ports of the first and second bulk acoustic wave devices,
    wherein the serial connection of the first ports of the first and second bulk acoustic wave devices is such that the second terminal of the first port of the first bulk acoustic wave device is coupled to the first terminal of the first port of the second bulk acoustic wave device,
    wherein the second system port is provided by the serial connection of the second ports of the first and second bulk acoustic wave devices, and
    wherein the serial connection of the second ports of the first and second bulk acoustic wave devices is such that the first terminal of the second port of the first bulk acoustic wave device is connected to the second terminal of the second port of the second bulk acoustic wave device.

5. The apparatus according to claim 1,
    wherein the first system port is provided by the serial connection of the first ports of the first and second bulk acoustic wave devices,
    wherein the serial connection of the first ports of the first and second bulk acoustic wave devices is such that the first terminal of the first port of the first bulk acoustic wave device is connected to the first terminal of the first port of the second bulk acoustic wave device,
    wherein the second system port is provided by the serial connection of the second ports of the first and second bulk acoustic wave devices, and
    wherein the serial connection of the second ports of the first and second bulk acoustic wave devices is such that the second terminal of the second port of the first bulk acoustic wave device is connected to the second terminal of the second port of the second bulk acoustic wave device.

6. The apparatus according to claim 1,
    wherein the first system port is provided by the parallel connection of the first ports of the first and second bulk acoustic wave devices,
    wherein the parallel connection of the first ports of the first and second bulk acoustic wave devices is such that the first terminal of the first port of the first bulk acoustic wave device is connected to the second terminal of the first port of the second bulk acoustic wave device, wherein the second system port is provided by the serial connection of the second ports of the first and second bulk acoustic wave devices, and wherein the serial connection of the second ports of the first and second bulk acoustic wave devices is such that the second terminal of the second port of the first bulk acoustic wave device is connected to the second terminal of the second port of the second bulk acoustic wave device.

7. The apparatus according to claim 1,
wherein the first system port is provided by the parallel connection of the first ports of the first and second bulk acoustic wave devices, wherein the parallel connection of the first ports of the first and second bulk acoustic wave devices is such that the first terminal of the first port of the first bulk acoustic wave device is connected to the first terminal of the first port of the second bulk acoustic wave device, wherein the second system port is provided by the serial connection of the second ports of the first and second bulk acoustic wave devices, and wherein the serial connection of the second ports of the first and second bulk acoustic wave devices is such that the second terminal of the second port of the first bulk acoustic wave device is connected to the first terminal of the second port of the second bulk acoustic wave device.

8. A bulk acoustic wave device, comprising:
a first resonator comprising a first electrode, a first piezoelectric layer disposed at least partially on the first electrode, a second electrode disposed at least partially on the first piezoelectric layer;
a first stack crystal filter comprising a third electrode, a second piezoelectric layer disposed at least partially on the third electrode, a fourth electrode disposed at least partially on the second piezoelectric layer, a third piezoelectric layer disposed at least partially on the fourth electrode, a fifth electrode disposed at least partially on the third piezoelectric layer;
a coupling layer structure disposed between the first resonator and the first stack crystal filter;
a second resonator comprising a sixth electrode, a fourth piezoelectric layer disposed at least partially on the sixth electrode, a seventh electrode disposed at least partially on the fourth piezoelectric layer;
a second stack crystal filter comprising an eighth electrode, a fifth piezoelectric layer disposed at least partially on the eighth electrode, a ninth electrode disposed at least partially on the fifth piezoelectric layer, a sixth piezoelectric layer disposed at least partially on the ninth electrode, a tenth electrode disposed at least partially on the sixth piezoelectric layer;
a further coupling layer structure disposed between the second resonator and the second stack crystal filter; and
a first port comprising a first terminal and a second terminal; and a second port comprising a first terminal and a second terminal, wherein the first and the sixth electrodes are interconnected, and wherein the third and eighth electrodes are interconnected, and wherein the fifth and tenth electrodes are interconnected, wherein the second electrode is coupled to the first terminal of the first port, and the seventh electrode is coupled to the second terminal of the first port, and wherein the fourth electrode is coupled to the first terminal of the second port, and the ninth electrode is coupled to the second terminal of the second port.

9. An apparatus, comprising:
a first bulk acoustic wave device;
a second bulk acoustic wave device;
wherein the first bulk acoustic wave device and the second bulk acoustic wave device each respectively comprise:
a first resonator comprising a first electrode, a first piezoelectric layer disposed at least partially on the first electrode, a second electrode disposed at least partially on the first piezoelectric layer;
a first stack crystal filter comprising a third electrode, a second piezoelectric layer disposed at least partially on the third electrode, a fourth electrode disposed at least partially on the second piezoelectric layer, a third piezoelectric layer disposed at least partially on the fourth electrode, a fifth electrode disposed at least partially on the third piezoelectric layer; and
a coupling layer structure disposed between the first resonator and the first stack crystal filter
a first system port comprising a first and second terminal,
wherein a first terminal of the first system port is coupled with one electrode of the first and second electrodes of the first bulk acoustic wave device,
wherein a second terminal of the first system port is coupled with one electrode of the first and second electrodes of the second bulk acoustic wave device, and
wherein another electrode of the first and second electrodes of the first bulk acoustic wave device is coupled with another electrode of the first and second electrodes of the first bulk acoustic wave device; and
a second system port comprising a first and second terminal,
wherein the first terminal of the second system port is connected with one electrode of third, fourth and fifth electrodes of the first bulk acoustic wave device,
wherein the second terminal of the second system port is connected with one electrode of the third, fourth and fifth electrodes of the second bulk acoustic wave device,
wherein another electrode of the third, fourth and fifth electrodes of the first bulk acoustic wave device is connected with another electrode of the third, fourth and fifth electrodes of the second bulk acoustic wave device,
wherein a remaining electrode of the third, fourth and fifth electrodes of the first bulk acoustic wave device is connected with a remaining electrode of the third, fourth and fifth electrodes of the second bulk acoustic wave device.

* * * * *